(12) United States Patent
Yoshida et al.

(10) Patent No.: US 9,929,335 B2
(45) Date of Patent: Mar. 27, 2018

(54) PIEZOELECTRIC VIBRATOR

(71) Applicants: TEIJIN LIMITED, Osaka-shi, Osaka (JP); A SCHOOL CORPORATION KANSAI UNIVERSITY, Suita-shi, Osaka (JP)

(72) Inventors: Tetsuo Yoshida, Gifu (JP); Yoshiro Tajitsu, Osaka (JP); Atsuko Kato, Gifu (JP)

(73) Assignees: TEIJIN LIMITED, Osaka (JP); A SCHOOL CORPORATION KANSAI UNIVERSITY, Osaka (JP)

( * ) Notice: Subject to any disclaimer, the term of this patent is extended or adjusted under 35 U.S.C. 154(b) by 280 days.

(21) Appl. No.: 14/652,302

(22) PCT Filed: Jan. 23, 2014

(86) PCT No.: PCT/JP2014/052174
§ 371 (c)(1),
(2) Date: Jun. 15, 2015

(87) PCT Pub. No.: WO2014/119695
PCT Pub. Date: Aug. 7, 2014

(65) Prior Publication Data
US 2016/0005951 A1    Jan. 7, 2016

(30) Foreign Application Priority Data

Jan. 31, 2013  (JP) ................. 2013-017072

(51) Int. Cl.
*H01L 41/09*    (2006.01)
*H01L 41/083*   (2006.01)
(Continued)

(52) U.S. Cl.
CPC .......... *H01L 41/09* (2013.01); *H01L 41/0471* (2013.01); *H01L 41/0536* (2013.01);
(Continued)

(58) Field of Classification Search
CPC ..... H01L 41/083; H01L 41/193; H01L 41/09; H01L 41/0471; H01L 41/0536
(Continued)

(56) References Cited

U.S. PATENT DOCUMENTS

2003/0102774 A1    6/2003  Carazo et al.
2004/0232807 A1*  11/2004  Pelrine ................... F04B 35/00
                                                      310/330

(Continued)

FOREIGN PATENT DOCUMENTS

CN    102027609 A    4/2011
JP    2003244792 A   8/2003
(Continued)

OTHER PUBLICATIONS

International Search Report of PCT/JP2014/052174 dated Apr. 28, 2014.

*Primary Examiner* — Derek Rosenau
(74) *Attorney, Agent, or Firm* — Sughrue Mion, PLLC

(57) ABSTRACT

The invention relates to a piezoelectric vibrator having a piezoelectric laminate in which oriented film layers made of a polylactic acid and conductive layers are laminated alternately and grippers gripping both ends of the piezoelectric laminate, wherein one of two conductive layers neighboring via an oriented film layer is short-circuited to a negative electrode and the other conductive layer is short-circuited to a positive electrode, the oriented film layers interposed between the respective conductive layers are laminated such that the oriented film layers expand and contract in the same direction when a current is applied, the piezoelectric laminate has two parallel surfaces which are parallel to the plane direction of the oriented film layers and two end faces A and
(Continued)

B which are between the parallel surfaces and parallel to each other, and the gripped ends respectively include the end face A and the end face B.

17 Claims, 18 Drawing Sheets

(51) Int. Cl.
*H01L 41/193* (2006.01)
*H04R 17/00* (2006.01)
*H01L 41/277* (2013.01)
*H01L 41/047* (2006.01)
*H01L 41/053* (2006.01)
*H04R 7/04* (2006.01)

(52) U.S. Cl.
CPC .......... *H01L 41/083* (2013.01); *H01L 41/193* (2013.01); *H01L 41/277* (2013.01); *H04R 17/005* (2013.01); *H04R 7/04* (2013.01)

(58) Field of Classification Search
USPC .................................. 310/328, 330–332, 800
See application file for complete search history.

(56) References Cited

U.S. PATENT DOCUMENTS

| | | | |
|---|---|---|---|
| 2006/0119225 A1* | 6/2006 | Heim | ..................... H02N 2/101 310/339 |
| 2009/0255187 A1* | 10/2009 | Alexander | ............. B60J 10/244 49/477.1 |
| 2011/0062829 A1 | 3/2011 | Andoh et al. | |
| 2011/0109204 A1 | 5/2011 | Tajitsu et al. | |
| 2012/0025674 A1 | 2/2012 | Yoshida et al. | |
| 2013/0085390 A1* | 4/2013 | Nishikubo | ............ H01L 41/083 600/443 |
| 2013/0108061 A1 | 5/2013 | Ando et al. | |

FOREIGN PATENT DOCUMENTS

| | | |
|---|---|---|
| JP | 2011153023 A | 8/2011 |
| JP | 2011-243606 A | 12/2011 |
| JP | 2012-49789 A | 3/2012 |
| TW | 201039474 A1 | 11/2010 |
| WO | 2009050236 A1 | 4/2009 |
| WO | 2009/139237 A1 | 11/2009 |
| WO | 2009/144972 A1 | 12/2009 |
| WO | 2012/060235 A1 | 5/2012 |
| WO | 2012/157691 A1 | 11/2012 |

* cited by examiner

PIEZOELECTRIC VIBRATOR

CROSS REFERENCE TO RELATED APPLICATIONS

This application is a National Stage of International Application No. PCT/JP2014/052174 filed Jan. 23, 2014 (claiming priority based on Japanese Patent Application No. 2013-017072, filed Jan. 31, 2013), the contents of which are incorporated herein by reference in their entirety.

TECHNICAL FIELD

The present invention relates to a piezoelectric vibrator using an oriented film layer made of a polylactic acid.

BACKGROUND ART

PTL 1 discloses that a transparent piezoelectric film speaker is curved and attached to the screen of a mobile phone so that the sounds are output from a wide area and the hearing property from the speaker is improved. In a specifically disclosed method which is suggested, a surface of one of rectangular PVDF (polyvinyl vinylidene fluoride) films in the thickness direction and a surface of the other PVDF film are laminated in such a manner that the surfaces have opposite expansion and contraction behaviors when an electric charge is applied (so-called bimorph structure), and the two short sides are fixed. Sounds are produced by the vibrations generated by curving the films.

PTL 2 proposes a piezoelectric speaker in which an active electrode area is provided on a polymer piezoelectric sheet in the direction along the main surface and the active electrode area is sectioned. By applying electric charges to the active electrode area in such a manner that the electric field vectors generated in neighboring active electrode sections in the thickness direction of the piezoelectric sheet are opposite to each other, even when the four sides of a square piezoelectric sheet are fixed, the piezoelectric sheet warps and sounds can be output. In addition, an L-polylactic acid, which is a chiral polymer, is proposed as the polymer constituting the piezoelectric sheet.

Moreover, in PTL 3 and PTL 4, the present inventors have suggested that the displacement force can be increased by laminating layers made of a poly-L-lactic acid and a poly-D-lactic acid.

Here, in order to bond a piezoelectric element to a diaphragm and produce a sound, there are two systems: a system in which the expansion and contraction displacement of the piezoelectric element warps the diaphragm and the curving vibration produces a sound, and a system in which in-plane expansion and contraction of the piezoelectric element produces an in-plane vibration in the adhered diaphragm and the resonance produces a sound. Because a piezoelectric element made of a polymer has a lower piezoelectric modulus and a weaker force than a piezoelectric ceramic such as PZT, such a piezoelectric element is not suitable for resonating a hard diaphragm, and the system using the curving vibrations of the piezoelectric element has been used as in PTLs 1 and 2.

CITATION LIST

Patent Literature

PTL 1: JP-A-2003-244792
PTL 2: WO2009/50236
PTL 3: JP-A-2011-243606
PTL 4: JP-A-2011-153023

SUMMARY OF INVENTION

Technical Problem

An object of the invention is to provide a piezoelectric vibrator capable of effectively generating a sound wave when a voltage is applied and instantly producing a vibration which is called haptics.

Solution to Problem

The invention relates to a piezoelectric vibrator having a piezoelectric laminate in which oriented film layers made of a polylactic acid and conductive layers are laminated alternately and grippers gripping both ends of the piezoelectric laminate: wherein
(i) the piezoelectric laminate is laminated in such a manner that one of two conductive layers neighboring via an oriented film layer is short-circuited to a negative electrode and the other conductive layer is short-circuited to a positive electrode and the oriented film layers interposed between the respective conductive layers expand and contract in the same direction when a current is applied;
(ii) the piezoelectric laminate has two parallel surfaces which are parallel to the plane direction of the oriented film layers and two end faces A and B which are between the parallel surfaces and parallel to each other; and
(iii) the gripped ends respectively include the end face A and the end face B, and a stress is applied by the grippers to the part of the piezoelectric laminate between the end faces A and B.

In addition, a preferable embodiment of the piezoelectric vibrator of the invention is a piezoelectric vibrator having at least any of: a piezoelectric vibrator, wherein the shape of the piezoelectric laminate is a tape; a piezoelectric vibrator 1, wherein the grippers gripping the ends are fixed on a diaphragm and the stress applied to the piezoelectric laminate by the grippers is a tensile stress; the piezoelectric vibrator 1, wherein the end faces A and B are at the ends of the piezoelectric laminate in the longitudinal direction; a piezoelectric vibrator 2, wherein the stress applied to the piezoelectric laminate by the grippers is a compressive stress; the piezoelectric vibrator 2, wherein the positions of the grippers at the ends are fixed; the piezoelectric vibrator 2, wherein the positions of the grippers at the ends are movable according to expansion and contraction of the piezoelectric laminate; the piezoelectric vibrator 2, wherein the end faces A and B are at the ends of the piezoelectric laminate parallel to the longitudinal direction; a piezoelectric vibrator, wherein the number of the oriented film layers in the piezoelectric laminate is three or larger; a piezoelectric vibrator, wherein the oriented film layers each have a thickness of 25 μm or less; a piezoelectric vibrator, wherein each of the oriented film layers is at least a kind selected from the group consisting of an oriented film layer L made of a resin L containing a poly-L-lactic acid as the main component and an oriented film layer D made of a resin D containing a poly-D-lactic acid as the main component; a piezoelectric vibrator, wherein the direction of the maximum expansion and contraction of the piezoelectric laminate is parallel to or at a right angle to the end faces A and B; a piezoelectric vibrator, wherein the conductive layers have a surface specific resistance of $1 \times 10^4 \Omega/\square$ or less; and a piezoelectric vibrator which is used for a piezoelectric speaker or a signal input apparatus.

Advantageous Effects of Invention

In the piezoelectric vibrator of the invention, the piezoelectric laminate is formed by laminating the oriented film layers via the conductive layers in such a manner that the oriented film layers expand and contract in the same direction when an electric charge is applied, and a stress is applied to the piezoelectric laminate by the grippers at both ends of the piezoelectric laminate. As a result, the piezoelectric vibrator of the invention can efficiently convert a vibration in the piezoelectric laminate into a sound wave and transmit the sound wave as a vibration which is called haptics.

DESCRIPTION OF BEST EMBODIMENTS

First, the piezoelectric laminate of the invention and the piezoelectric vibrator of the invention are explained using the drawings.

Figure 1:
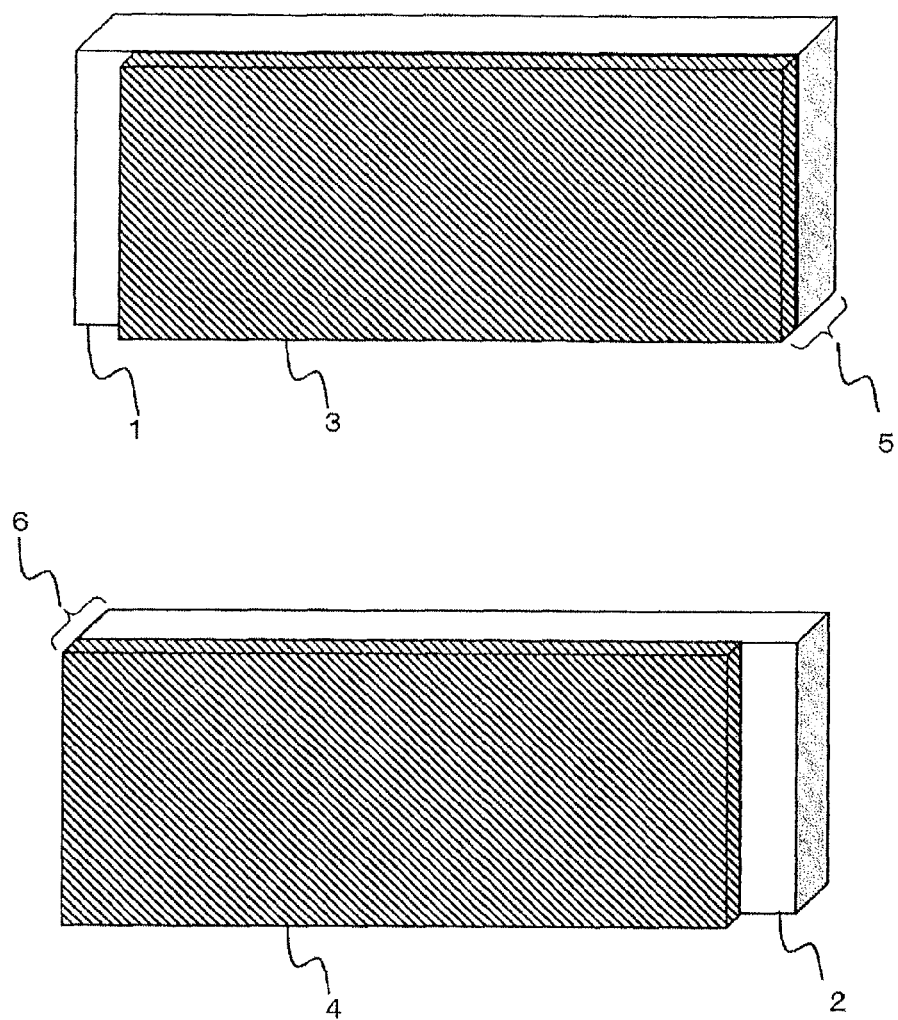
FIG. 1 is a perspective view of examples of a conductive layer-having film layer A (5) and a conductive layer-having film layer B (6) which are used in the invention.

FIG. 1 is a perspective view of examples of a conductive layer-having film layer A and a conductive layer-having film layer B which are used in the invention. The symbol 1 in FIG. 1 indicates an oriented film layer A, the symbol 2 indicates an oriented film layer B, the symbol 3 indicates a conductive layer A, the symbol 4 indicates a conductive layer B, the symbol 5 indicates a conductive layer-having film layer A which has a margin without the conductive layer at the left side, and the symbol 6 indicates a conductive layer-having film layer B which has a margin without the conductive layer at the right side.

Figure 2:
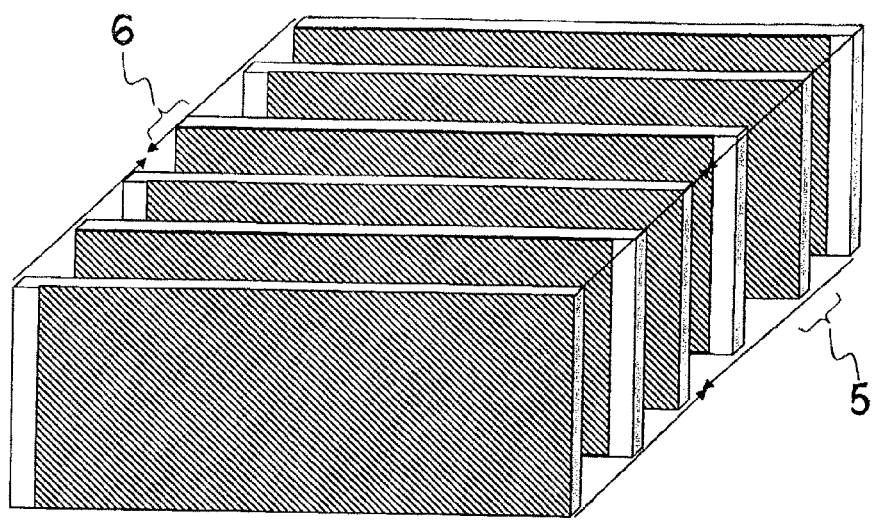
FIG. 2 is a perspective view of lamination of the conductive layer-having film layers A (5) and the conductive layer-having film layers B (6), which are used in the invention.

FIG. 2 is a perspective view of lamination of the conductive layer-having film layers A and the conductive layer-having film layers B, which are used in the invention. FIG. 2 shows that the conductive layer-having film layers A and the conductive layer-having film layers B shown in FIG. 1 are laminated alternately in such a manner that the conductive layers are disposed alternately at both ends.

Figure 3:
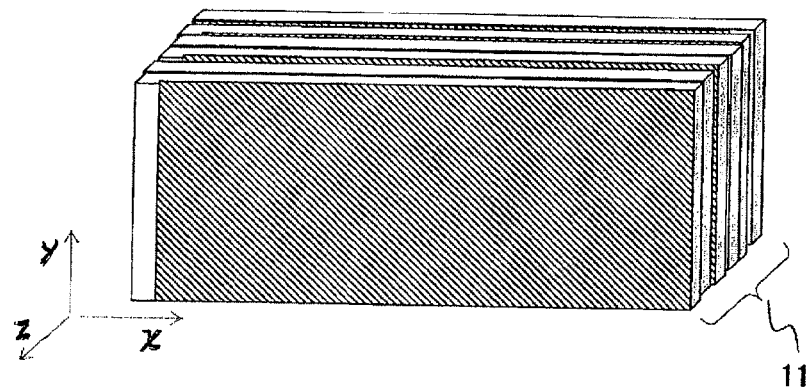
FIG. 3 is a perspective view of the piezoelectric laminate obtained by the lamination shown in FIG. 2.

FIG. 3 is a perspective view of the piezoelectric laminate (symbol 11) obtained by the lamination shown in FIG. 2. The conductive layers and the oriented film layers are laminated alternately in such a manner that one of two conductive layers neighboring via an oriented film layer can be short-circuited to a negative electrode and the other conductive layer can be short-circuited to a positive electrode. By laminating the layers in this manner, opposite electric charges can be applied to neighboring oriented film layers in the thickness direction. Thus, it is necessary that the oriented film layers interposed between the respective conductive layers are laminated in such a manner that the oriented film layers expand and contract in the same direction when a current is applied. When a resin which expands and contracts in a different direction is included in part of the piezoelectric laminate, the piezoelectric effects counterbalance and the effect of resonating the diaphragm is adversely affected. The method for arranging the oriented film layers in the piezoelectric laminate so that the oriented film layers expand and contract in the same direction is not particularly restricted, but it is simple and efficient to use film layers made of a poly-L-lactic acid as the oriented film layers A and film layers made of a poly-D-lactic acid as the oriented film layers B, as described below.

Figure 4:
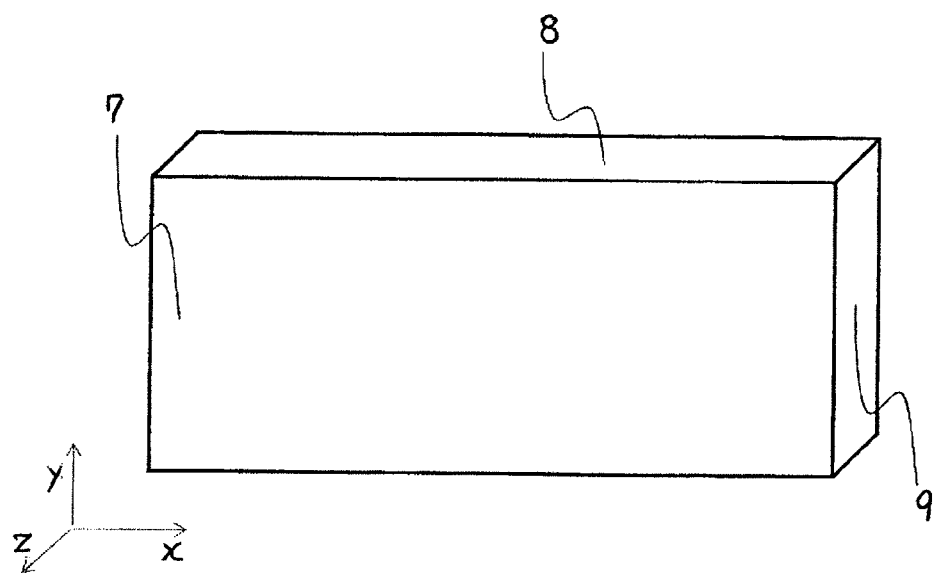
FIG. 4 is a schematic view showing the surfaces of the piezoelectric laminate shown in FIG. 3.

FIG. 4 is a schematic view showing the surfaces of the piezoelectric laminate shown in FIG. 3. The symbol 7 in FIG. 4 indicates two surfaces which are in the lamination direction of the piezoelectric laminate and parallel to the plane direction of the oriented film layers, and the surfaces are referred to as parallel surfaces of the piezoelectric laminate below in the invention. In the conventional piezoelectric speakers, the parallel surfaces are the surfaces which are attached to the diaphragm and produce a vibration. The symbols 8 and 9 in FIG. 4 indicate faces between the parallel surfaces, and the faces are referred to as end faces below in the invention. In addition, among the end faces, the symbol 8 indicates the end faces parallel to the longitudinal direction of the piezoelectric laminate, and the symbol 9 indicates the end faces which are not parallel to the longitudinal direction of the piezoelectric laminate. Two facing end faces are referred to as an end face A and an end face B. Thus, in FIG. 4, when the end face A is the face indicated by the symbol 8, the base is referred to as the end face B below.

Figure 5:
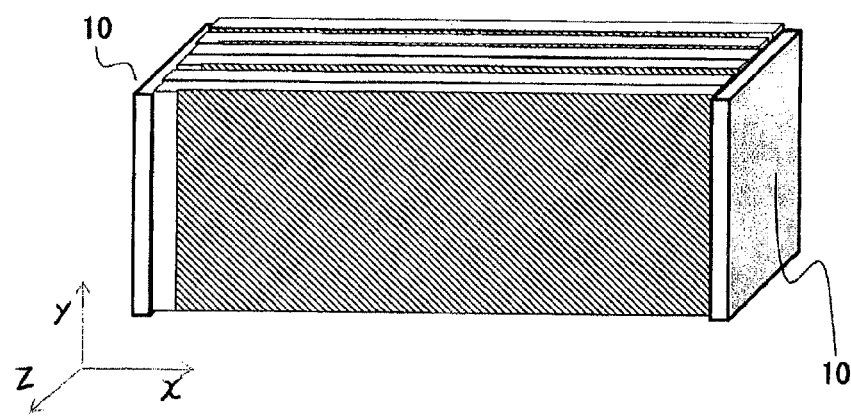
FIG. 5 is a perspective view of the piezoelectric laminate shown in FIG. 3 to which electrodes (10) are attached.

FIG. 5 is a perspective view of the piezoelectric laminate (11) shown in FIG. 3 to which electrodes (10) are attached. The symbol 10 indicates electrodes for short-circuiting to a negative electrode (or a positive electrode) for example. The electrodes are not restricted as long as neighboring conductive layers are not short-circuited to each other but can be short-circuited alternately to a positive electrode and a negative electrode, and an example is a silver paste which will be described below. Naturally, a conductive wire may be directly connected to each of the conductive layers without using the electrodes.

Figure 6:
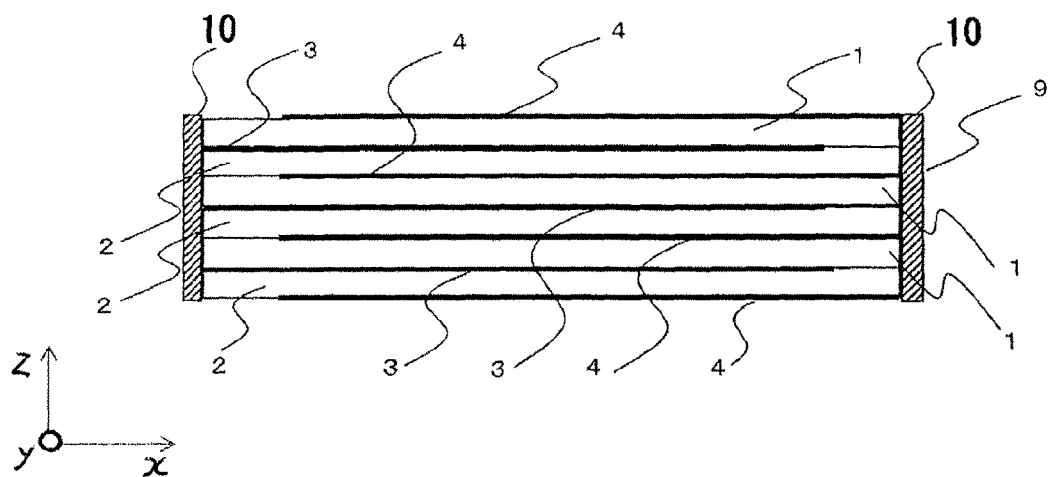
FIG. 6 is a two-dimensional view of the piezoelectric laminate shown in FIG. 5 seen from the y-direction.

FIG. 6 is a two-dimensional view of the piezoelectric laminate shown in FIG. 5 seen from the y-direction. Neighboring conductive layers are short-circuited alternately to the respective electrodes. In this regard, as shown in FIG. 6, the number of the conductive layers is preferably n+1, where n indicates the number of the oriented film layers in the piezoelectric laminate. This allows the current to flow in all of the oriented film layers in the piezoelectric laminate to exhibit the piezoelectric property.

Figure 7:
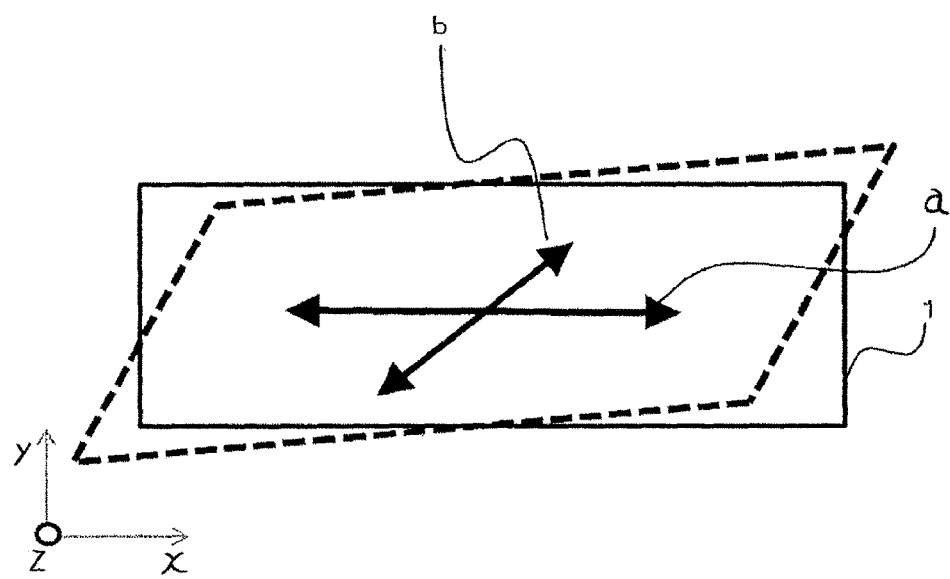
FIG. 7 is a two-dimensional view showing the deformation of a rectangular oriented film layer when a current is applied.
Figure 8:
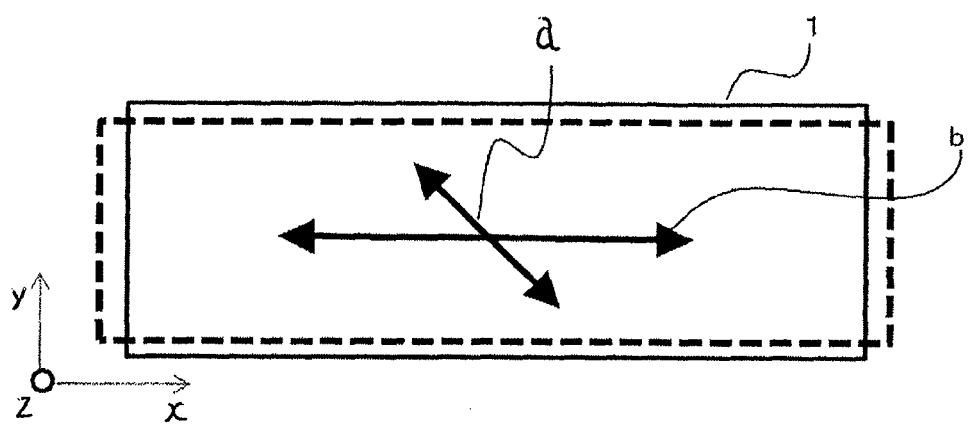
FIG. 8 is another two-dimensional view showing the deformation of a rectangular oriented film layer when a current is applied.
Figure 9:
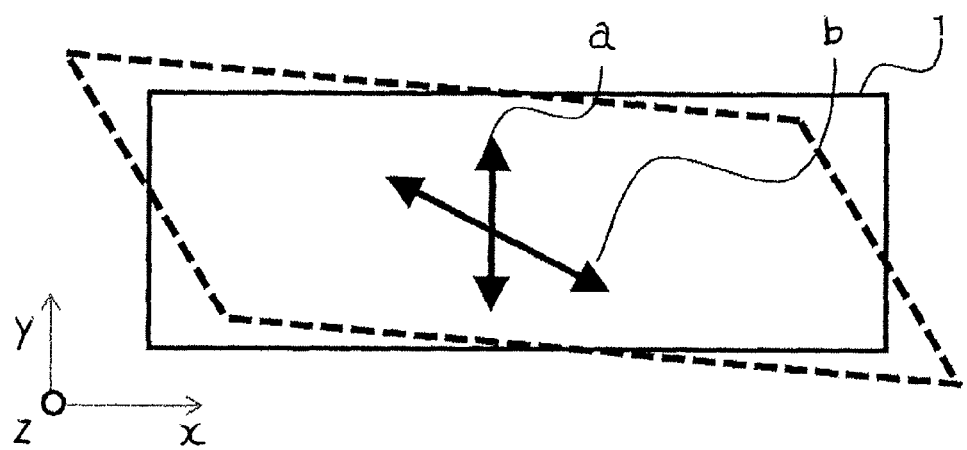
FIG. 9 is another two-dimensional view showing the deformation of a rectangular oriented film layer when a current is applied.

The relation between the main orientation direction and the deformation caused by the piezoelectric effect when a current is applied to an oriented film layer made of a polylactic acid, which is a helical chiral polymer, is explained using FIGS. 7 to 9. FIGS. 7 to 9 are two-dimensional views showing how rectangular oriented film layers deform when a current is applied. The direction a in FIGS. 7 to 9 is the main orientation direction of the oriented film layer, in plain words, the maximum stretching direction. When a current is applied to the oriented film layer made of a polylactic acid in the thickness direction, shear deformation is caused and a rectangle (solid line) deforms into a parallelogram (dotted line). The symbol b indicates the in-plane direction of the maximum in-plane displacement in the film, and in the oriented film made of a polylactic acid, the direction indicated by the symbol b forms an angle of 45° with the direction indicated by the symbol a. In this regard, for the purpose of further explanations, when the oriented film layer is cut into a rectangle, the cutting types are sometimes referred to as 0° cut, 45° cut and 90° cut depending on the angle between the longitudinal direction of the oriented film layer and the main orientation axis. Here, FIG. 7 shows the 0° cut, FIG. 8 shows the 45° cut and FIG. 9 shows the 90° cut.

The piezoelectric laminate of the invention is not restricted to those which are shown in FIG. 1 to FIG. 6, and examples thereof are shown in FIG. 10 to FIG. 13 as other preferable embodiments.

Figure 10:
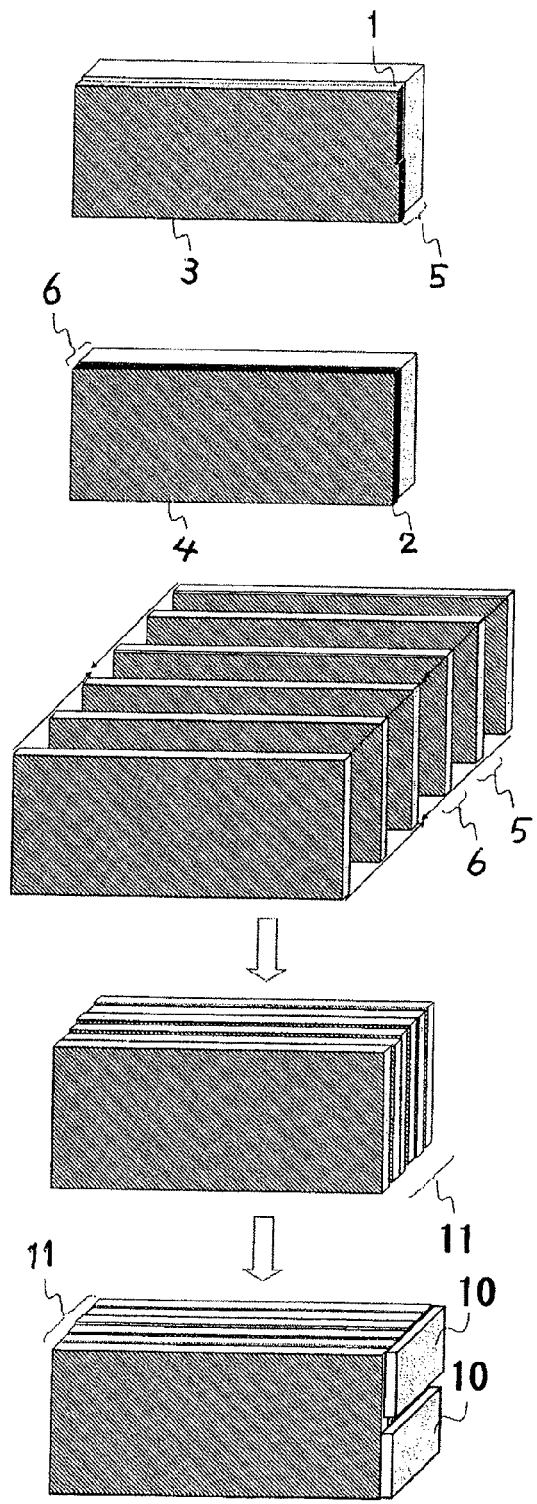
FIG. 10 is a perspective view showing another preferable embodiment of the piezoelectric laminate used in the invention.
Figure 11:
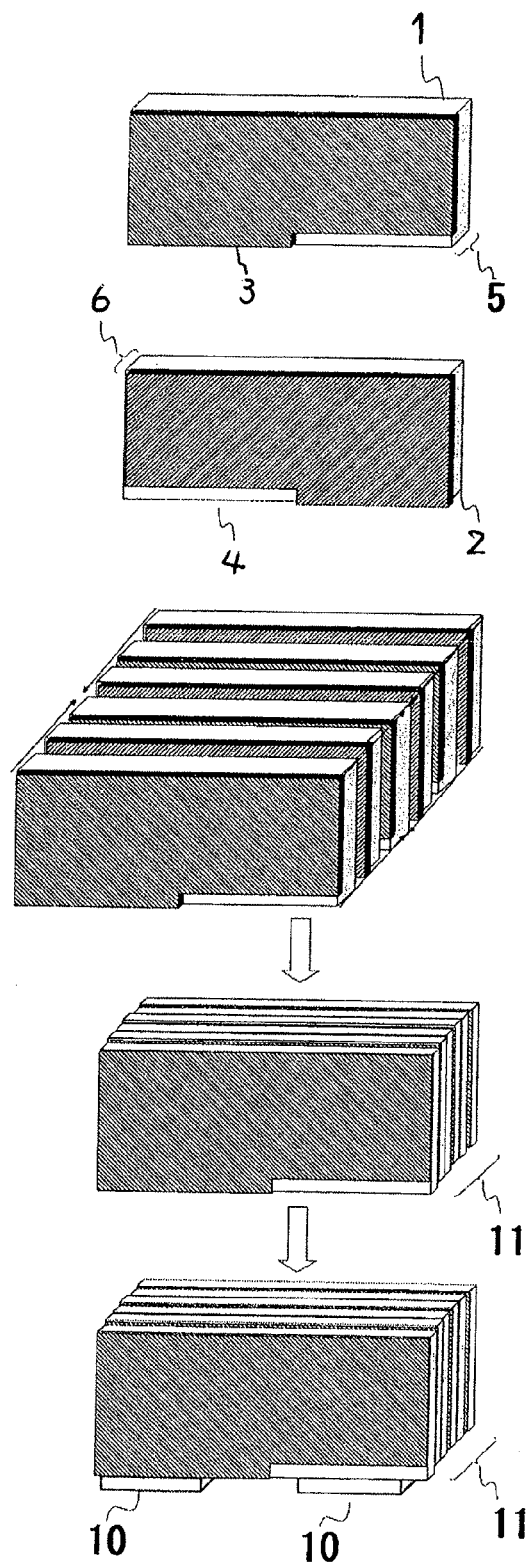
FIG. 11 is a perspective view showing another preferable embodiment of the piezoelectric laminate used in the invention.
Figure 12:
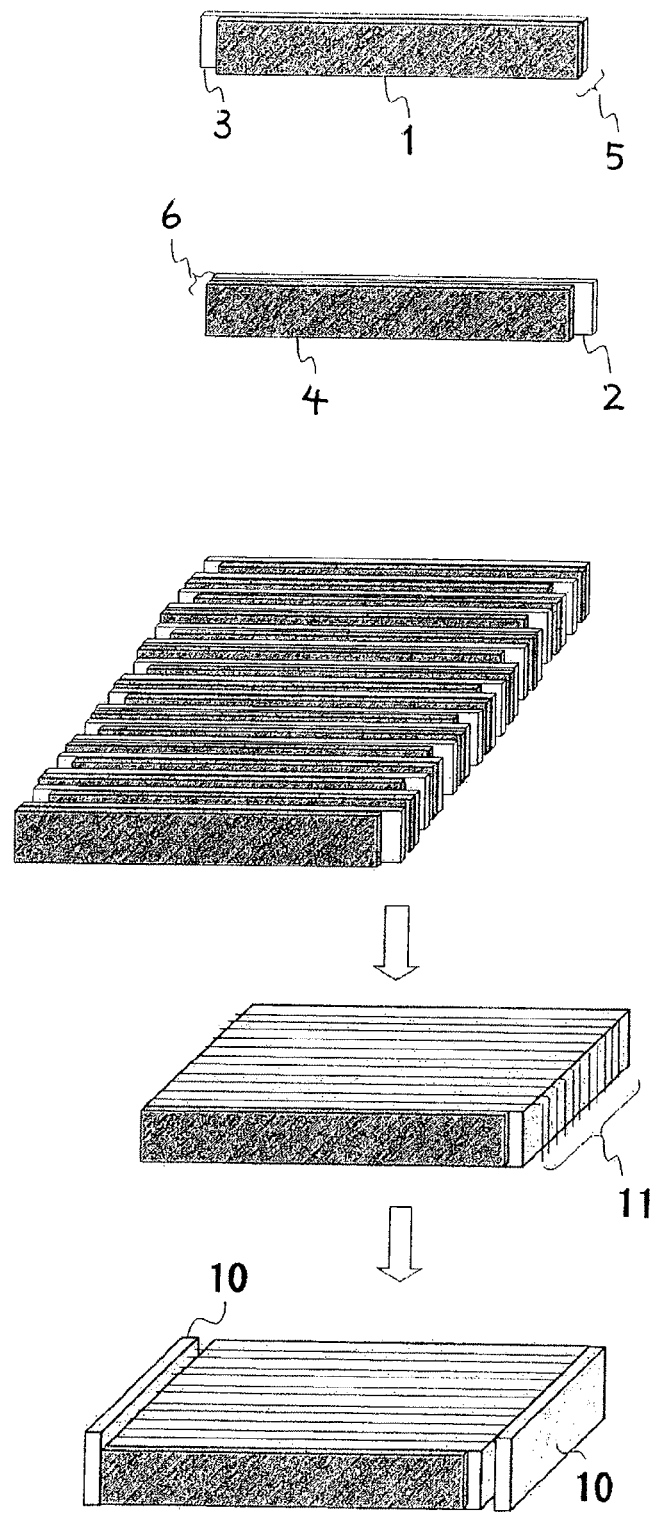
FIG. 12 is a perspective view showing another preferable embodiment of the piezoelectric laminate used in the invention.
Figure 13:
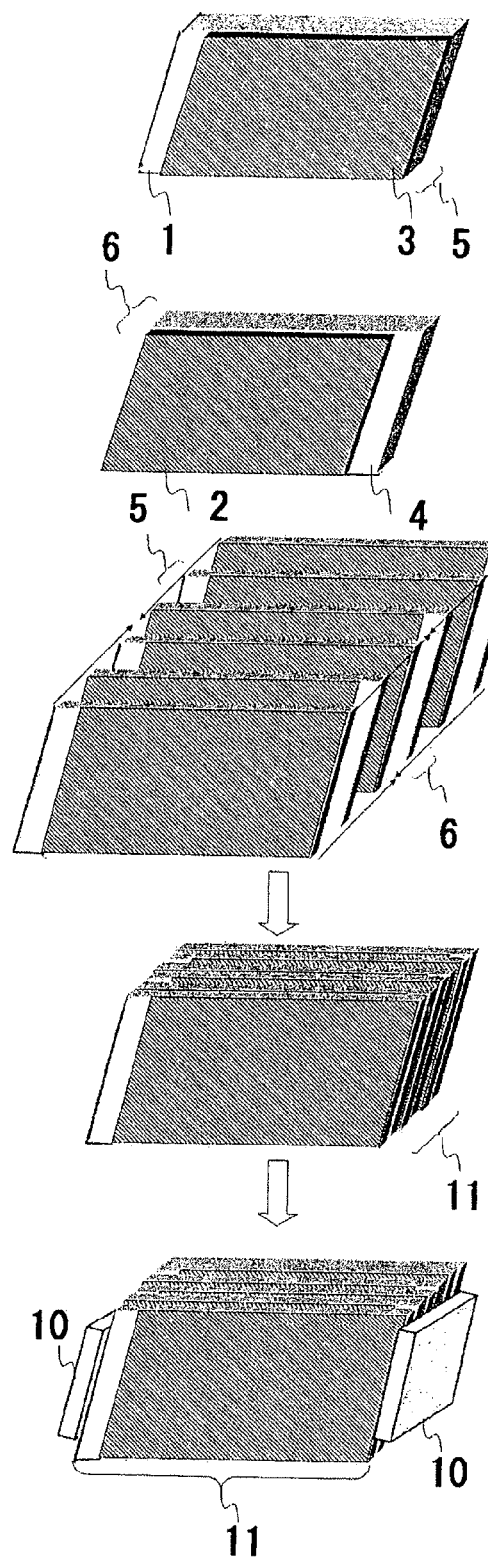
FIG. 13 is a perspective view showing another preferable embodiment of the piezoelectric laminate used in the invention.

FIG. 10 to FIG. 13 each contain five drawings aligned from top to bottom: the first and second drawings from the top correspond to FIG. 1, the third drawing from the top corresponds to FIG. 2, the fourth drawing from the top corresponds to FIG. 3 and the fifth drawing from the top corresponds to FIG. 5. FIG. 10 is a view showing the case using conductive layer-having film layers A which each have a margin in the top-right corner and conductive layer-having film layers B which each have a margin in the bottom-right corner; FIG. 11 is a view showing the case using conductive layer-having film layers A which each have a margin in the bottom-right corner and conductive layer-having film layers B which each have a margin in the bottom-left corner; FIG. 12 is a view showing the case using conductive layer-having film layers A and conductive layer-having film layers B, where the widths in the y-direction are extremely small; and FIG. 13 is a view showing the case in which the shapes of the conductive layer-having film layers A and the conductive layer-having film layers B are changed from a rectangle to a parallelogram.

Next, the piezoelectric vibrator of the invention is explained using FIG. 14 to FIG. 23. The piezoelectric vibrator of the invention is a piezoelectric vibrator having the piezoelectric laminate (11) in which the oriented film layers (1 or 2) made of a polylactic acid and the conductive layers (3 or 4) are laminated alternately and grippers (13) gripping both ends of the piezoelectric laminate (11).

(i) The piezoelectric laminate (11) is laminated in such a manner that one of two conductive layers neighboring via an oriented film layer is short-circuited to the negative electrode (10) and the other conductive layer is short-circuited to the positive electrode (10) and the oriented film layers (1 or 2) interposed between the respective conductive layers (3 or 4) expand and contract in the same direction when a current is applied.

(ii) The piezoelectric laminate (11) has the two parallel surfaces (7), which are parallel to the plane direction of the oriented film layers (1 or 2), and the two end faces A and B (8 or 9), which are between the parallel surfaces and parallel to each other. In FIG. 4, when the end face indicated by the symbol 8 is the end face A, the end face B is the base. In addition, in FIG. 4, although there are two pairs for the end faces A and B, in the invention, one of the pairs should be gripped as explained in (iii) below. That is, (iii) it is necessary that the gripped ends respectively include the end face A and the end face B and a stress is applied by the grippers to the part of the piezoelectric laminate between the end faces A and B. In this regard, the stress applied by the grippers to the part of the piezoelectric laminate between the end faces A and B may be a compressive stress or a tensile stress. By thus gripping the parallel end faces A and B of the piezoelectric laminate with the grippers and applying a stress to the part of the piezoelectric laminate between the end faces, the piezoelectric property improves probably because the piezoelectric laminate is strained, and a vibration can be produced effectively because the piezoelectric laminate itself has highly piezoelectric layers.

Figure 24:
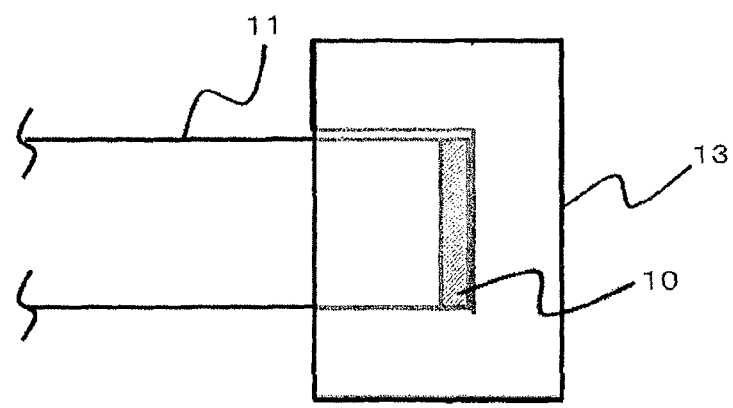
FIG. 24 is an example showing the method for gripping the piezoelectric laminate.
Figure 25:
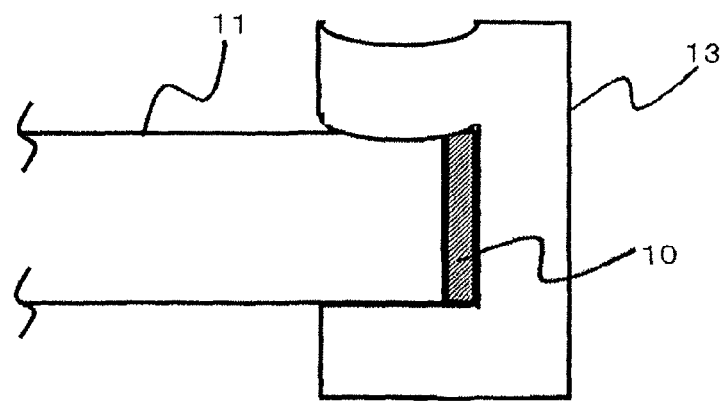
FIG. 25 is an example showing the method for gripping the piezoelectric laminate.
Figure 26:
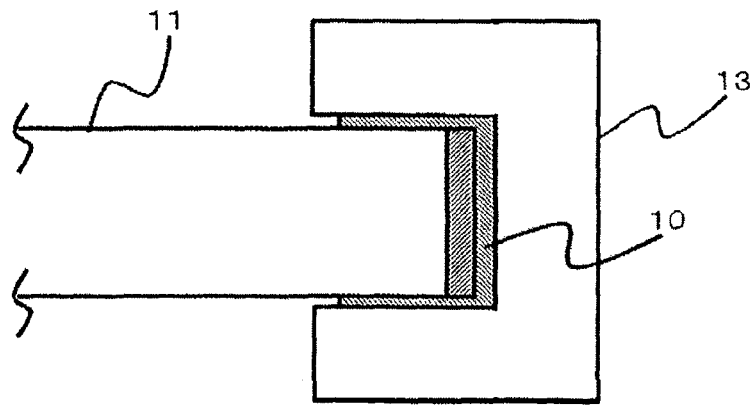
FIG. 26 is an example showing the method for gripping the piezoelectric laminate.
Figure 27:
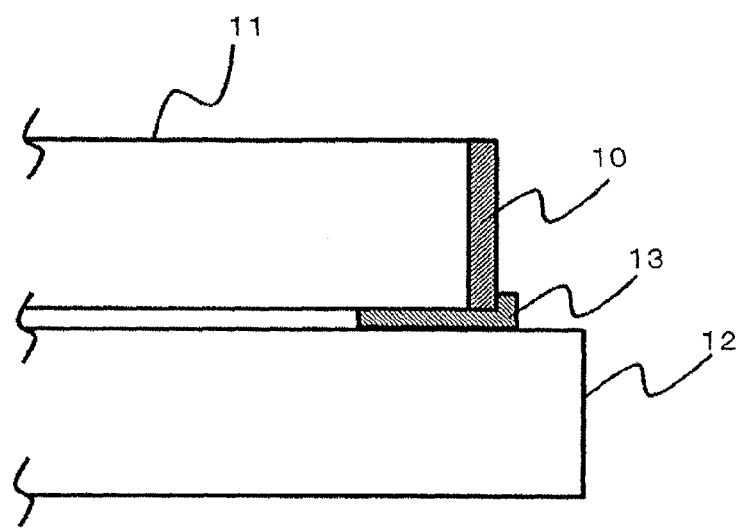
FIG. 27 is an example showing the method for gripping the piezoelectric laminate.

The grippers of the invention may be grippers capable of gripping the piezoelectric laminate to fix its position and applying a stress. Examples are a gripper with a groove like a cut-out into which the piezoelectric laminate is just inserted as in FIG. 24 and a gripper into which the piezoelectric laminate is inserted and which is then treated to reduce the groove width as in FIG. 25, and a clip may be used as the gripper. In addition, the gripper and the piezoelectric laminate may be adhered by filling the groove in the gripper with an adhesive or the like as in FIG. 26. Moreover, as in FIG. 27, the gripper itself may be an adhesive and adhered on a fixing device such as a diaphragm. When a compressive stress is applied to the piezoelectric laminate, any of the methods may be used, while the styles such as those shown in FIG. 25, FIG. 26 and FIG. 27 are preferable when a tensile stress is applied.

Figure 14:
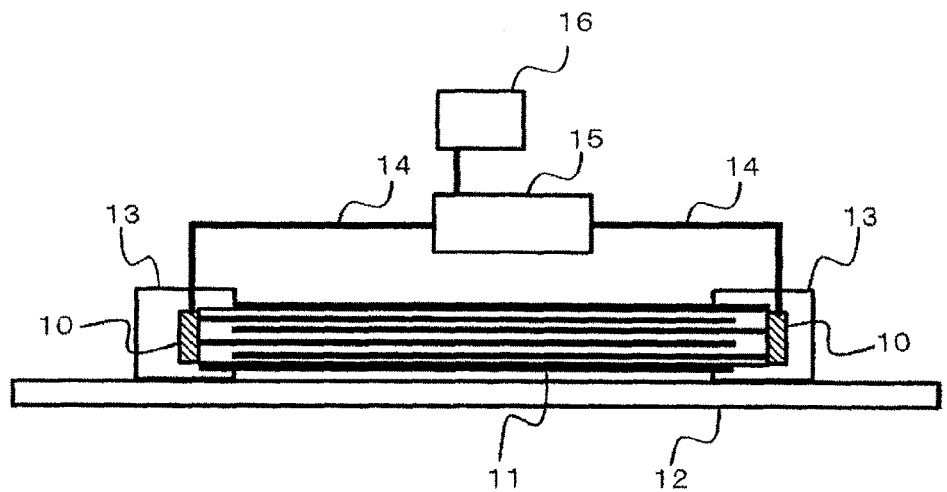
FIG. 14 is a two-dimensional view of the piezoelectric vibrator of the invention seen from a front surface.
Figure 15:
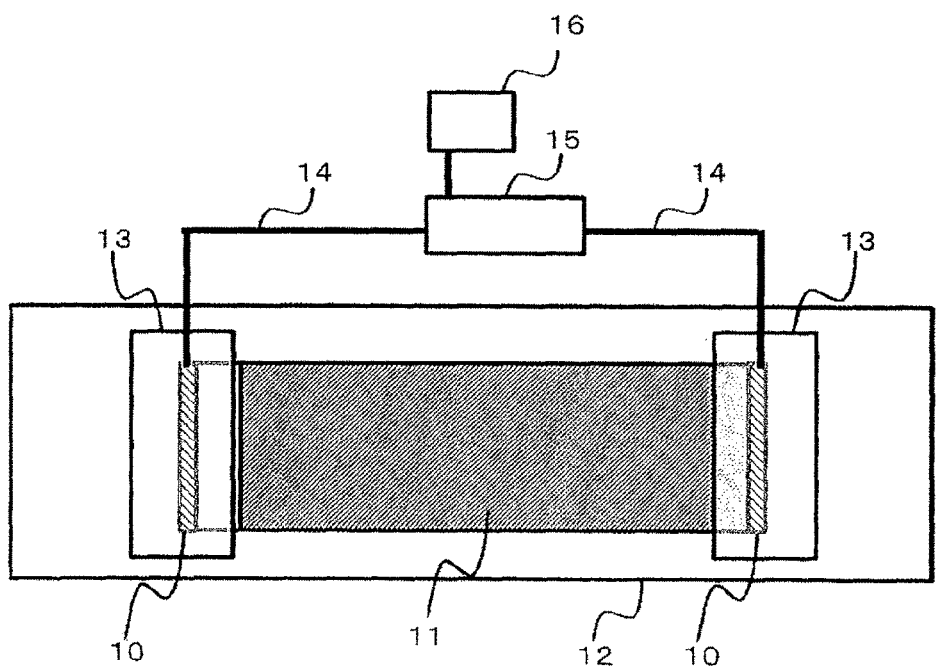
FIG. 15 is a two-dimensional view of the piezoelectric vibrator of the invention seen from a top surface.

First, the first preferable embodiment of the invention is explained using FIGS. 14 and 15.

As shown in FIG. 14 and FIG. 15, the first preferable embodiment of the invention is a piezoelectric vibrator in which the grippers (13) gripping the ends are fixed on a diaphragm (12) and the stress applied by the grippers (13) to the piezoelectric laminate is a tensile stress. To apply the tensile stress, the grippers (13) may be fixed on the diaphragm with the piezoelectric laminate being stretched. The range of the tensile stress is not particularly restricted and may be adjusted according to the frequency of the desired vibration. In this regard, applying the tensile stress is advantageous because a vibration at a low frequency is easily transmitted. Thus, when a signal is input to an input signal apparatus, a vibration can be produced instantly, and the piezoelectric vibrator is extremely preferable for transmitting the presence or absence of the input which is called haptics to a human.

Here, in order to produce a vibration at a low frequency with such a piezoelectric vibrator, it is desirable that the displacement is also larger. Thus, the gripped faces A and B are preferably at both ends of the piezoelectric laminate (11) in the longitudinal direction, as shown in FIG. 14 and FIG. 15.

In addition, the direction (b) of the maximum in-plane displacement caused by the piezoelectric strain in each oriented film layer preferably forms an angle of 45° with the longitudinal direction of the oriented film layer because the production of the piezoelectric laminate (11) becomes simple. On the other hand, in view of producing a vibration more efficiently, the direction (b) is preferably parallel to or at a right angle to the shortest straight line between the facing grippers (13). Particularly preferably, as shown in FIG. 14 and FIG. 15, the gripped end faces A and B are at both ends of the piezoelectric laminate (11) in the longitudinal direction and the direction (b) of the maximum in-plane displacement caused by the piezoelectric strain in the oriented film layer is parallel to or at a right angle to the longitudinal direction of the piezoelectric laminate. Most preferably, the direction (b) is parallel to the longitudinal direction.

Figure 16:
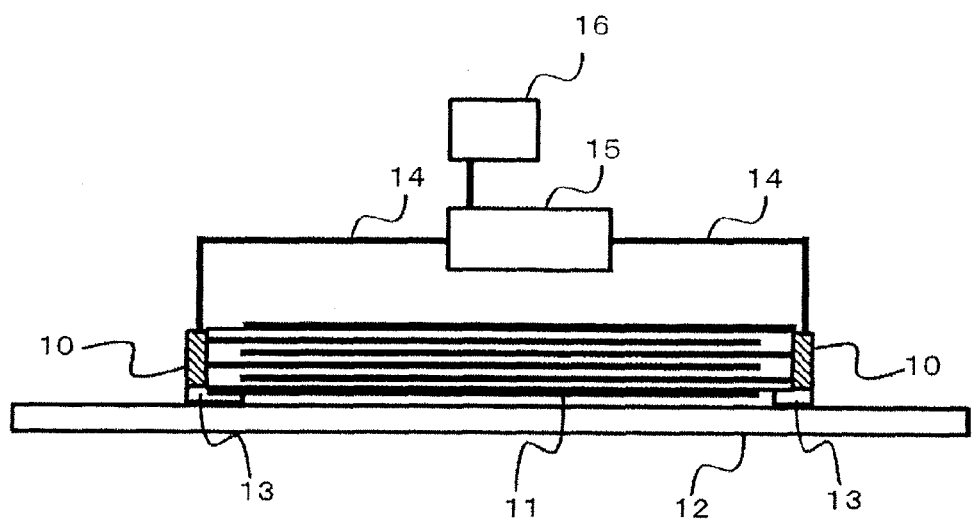
FIG. 16 is a two-dimensional view of another preferable embodiment of the piezoelectric vibrator of the invention seen from a front surface.
Figure 17:
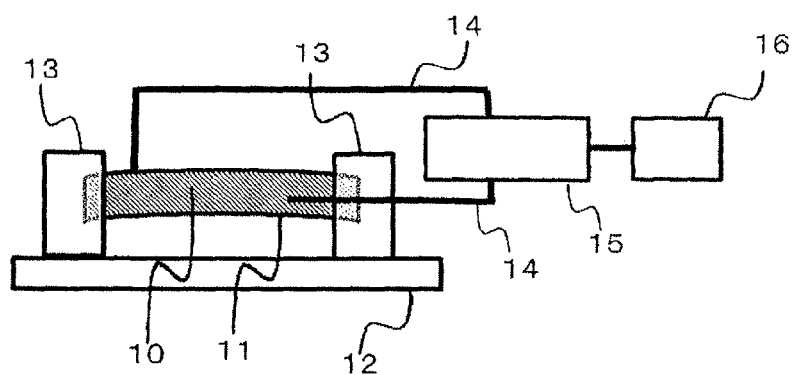
FIG. 17 is a two-dimensional view of another preferable embodiment of the piezoelectric vibrator of the invention seen from a top surface.

FIG. 16 and FIG. 17 show another embodiment of the first preferable embodiment of the invention, where a material capable of adhering such as an adhesive is used as the grippers and the grippers are fixed on the diaphragm. In such an embodiment, the thickness of the piezoelectric vibrator can be reduced.

Figure 18:
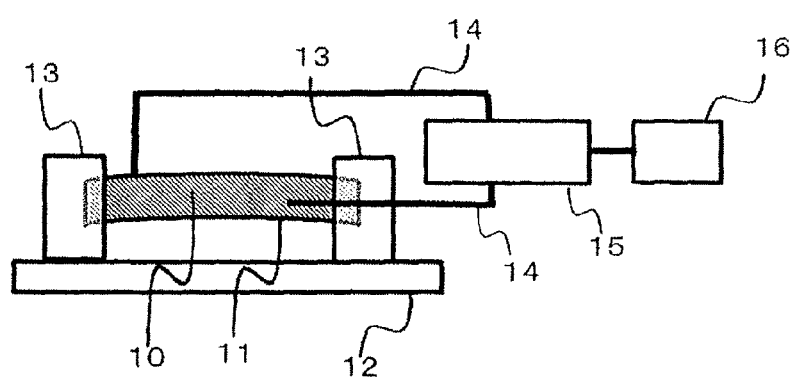
FIG. 18 is a two-dimensional view of another preferable embodiment of the piezoelectric vibrator of the invention seen from a front surface.
Figure 19:
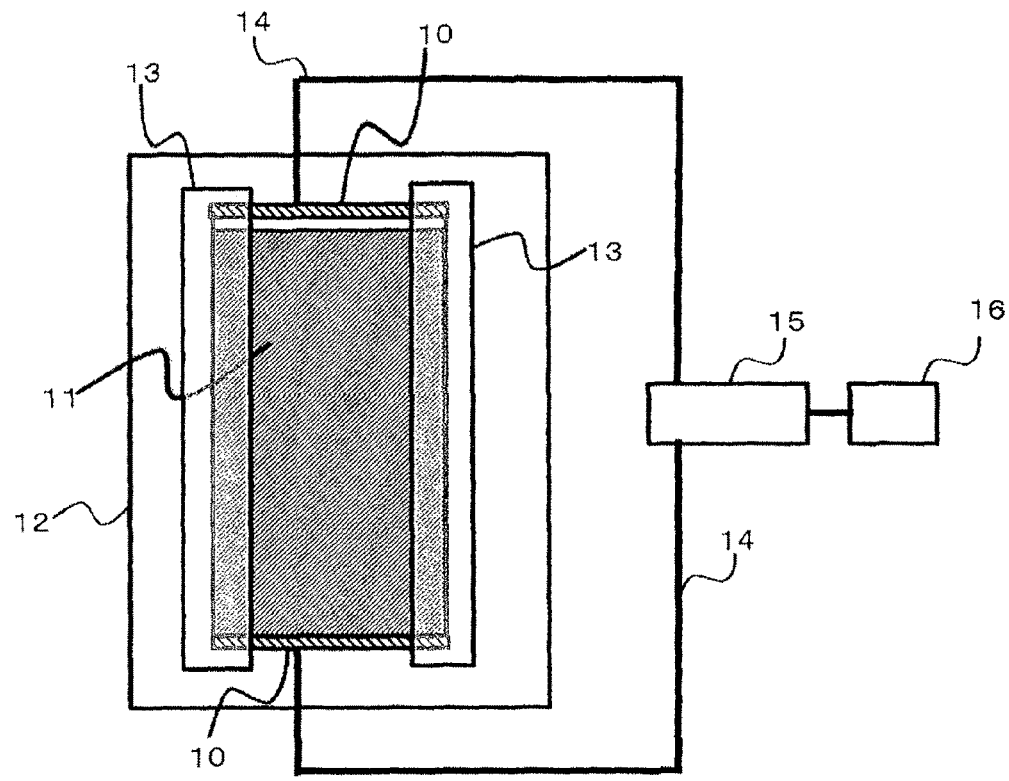
FIG. 19 is a two-dimensional view of another preferable embodiment of the piezoelectric vibrator of the invention seen from a top surface.

Next, the second preferable embodiment of the invention is explained using FIG. 18 and FIG. 19. As shown in FIG. 18 and FIG. 19, the second preferable embodiment of the invention is a piezoelectric vibrator in which the stress applied to the piezoelectric laminate by the grippers is a compressive stress. Because a compressive stress is applied, the piezoelectric laminate curves as shown in FIG. 18.

Here, in FIG. 18 and FIG. 19, it is preferable that the positions of the grippers (13) at both ends are fixed on the fixing device, and the fixing device here is preferably a diaphragm capable of transmitting a vibration.

By keeping applying the compressive stress, the piezoelectric vibrator itself can vibrate and produce a sound wave at a high frequency and the like, and when a diaphragm is used as the fixing device, the diaphragm can resonate with the vibration produced at the end faces of the piezoelectric laminate.

From such a point of view, the second embodiment can preferably be used for a piezoelectric speaker and the like.

In order to produce a vibration at a high frequency with such a piezoelectric vibrator, it is desirable to apply a higher compressive stress to the piezoelectric laminate. Thus, as shown in FIG. 18 and FIG. 19, the gripped end faces A and B are preferably the respective end faces parallel to the longitudinal direction of the piezoelectric laminate (11) because it is easier to apply the compressive stress to the piezoelectric laminate.

In addition, the direction (b) of the maximum in-plane displacement caused by the piezoelectric strain in each oriented film layer preferably forms an angle of 45° with the longitudinal direction of the oriented film layer because the production of the piezoelectric laminate (11) becomes simple. On the other hand, in view of producing a vibration more efficiently, the direction (b) is preferably parallel to or at a right angle to the shortest straight line between the facing grippers (13). Particularly preferably, as shown in FIG. 19, the gripped end faces A and B are the end faces parallel to the longitudinal direction of the piezoelectric laminate (11) and the direction (b) of the maximum in-plane displacement caused by the piezoelectric strain in the oriented film layer is parallel to or at a right angle to the longitudinal direction of the piezoelectric laminate. Most preferably, the direction (b) is parallel to the longitudinal direction.

Figure 20:
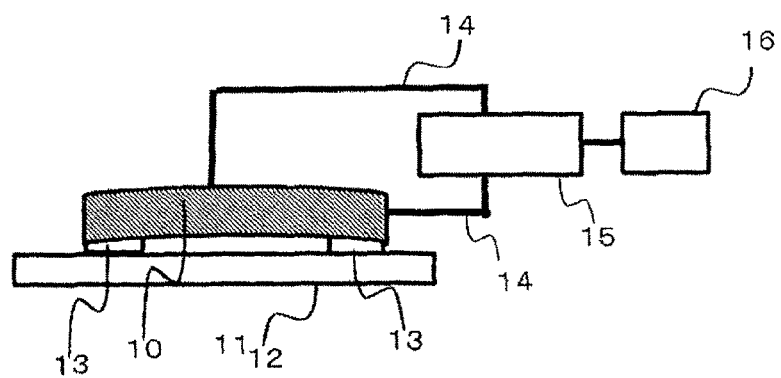
FIG. 20 is a two-dimensional view of another preferable embodiment of the piezoelectric vibrator of the invention seen from a front surface.
Figure 21:
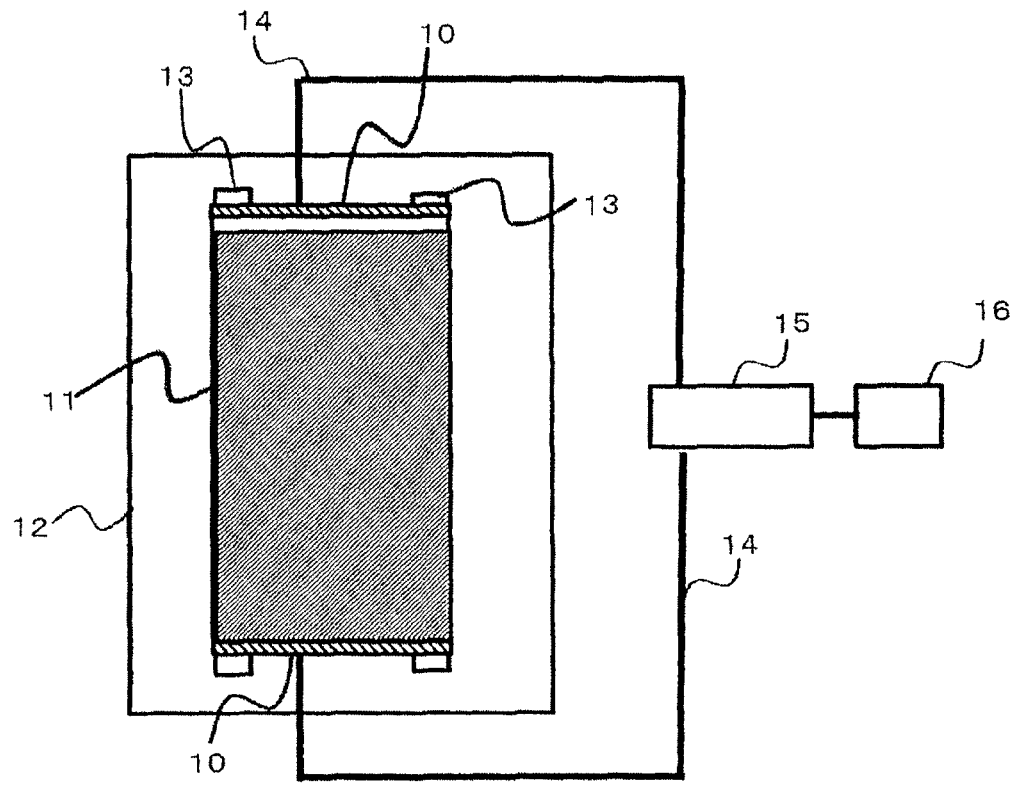
FIG. 21 is a two-dimensional view of another preferable embodiment of the piezoelectric vibrator of the invention seen from a top surface.

Next, FIG. 20 and FIG. 21 show another embodiment of the second preferable embodiment of the invention, where a material capable of adhering such as an adhesive is used as the grippers and the grippers are fixed on the diaphragm. In such an embodiment, the thickness of the piezoelectric vibrator can be reduced.

In this regard, the positions of the grippers do not have to be fixed completely in the second preferable embodiment of the invention. That is, in the piezoelectric vibrator, the positions of the grippers (13) at both ends may be movable according to expansion and contraction of the piezoelectric laminate, and such a piezoelectric vibrator can produce a sound wave at a wide range of frequency. Here, in FIG. 22, the grippers (13) are fixed with a fixing device (12), and the fixing device (12) changes the distance between the grippers (13) according to expansion and contraction of the piezoelectric laminate. For example, when a thin metal plate, plastic or the like is used as the fixing device (12), it is possible to slightly change the distance between the grippers (13), while applying the compressive stress to the piezoelectric laminate, according to expansion and contraction of the piezoelectric laminate.

Figure 23:
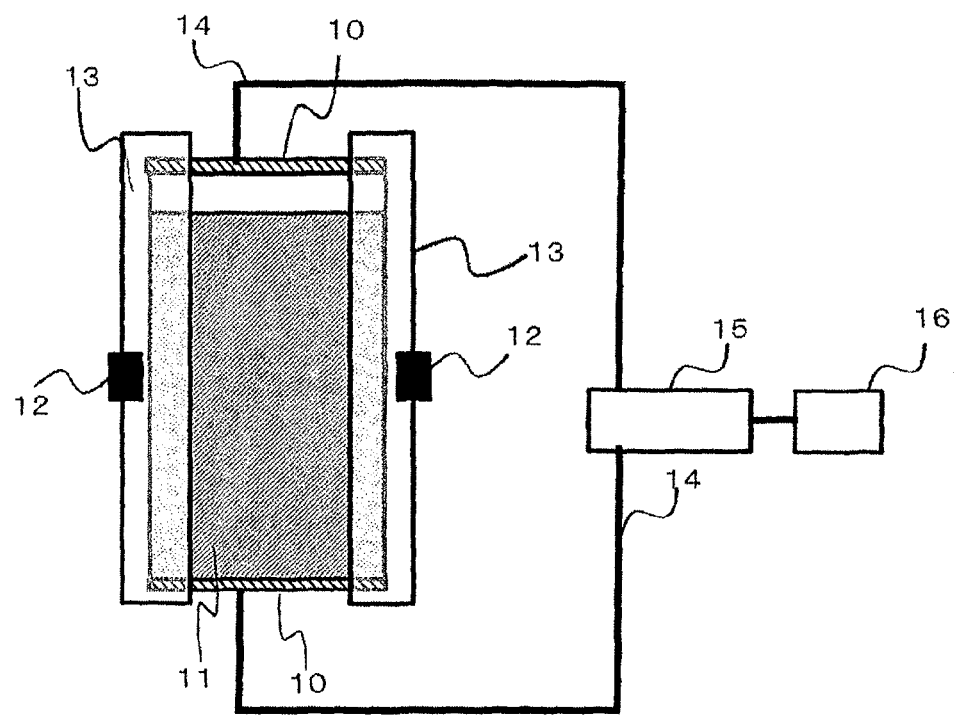
FIG. 23 is a two-dimensional view of another preferable embodiment of the piezoelectric vibrator of the invention seen from a top surface.

In the case of such a piezoelectric vibrator, in which the positions of the grippers (13) at both ends are movable according to expansion and contraction of the piezoelectric laminate, it is desirable that a vibration is produced to the maximum while keeping the shape of the piezoelectric laminate between the grippers. Thus, the gripped end faces A and B are preferably the respective end faces parallel to the longitudinal direction of the piezoelectric laminate (11) as shown in FIG. 23.

In addition, the direction (b) of the maximum in-plane displacement caused by the piezoelectric strain in each oriented film layer preferably forms an angle of 45° with the longitudinal direction of the oriented film layer because the production of the piezoelectric laminate (11) becomes simple. On the other hand, in view of producing a vibration more efficiently, the direction (b) is preferably parallel to or at a right angle to the shortest straight line between the facing grippers (13). Particularly preferably, as shown in FIG. 23, the gripped end faces A and B are the parallel end faces of the piezoelectric laminate (11) in the longitudinal direction and the direction (b) of the maximum in-plane displacement caused by the piezoelectric strain in the oriented film layer is parallel to or at a right angle to the longitudinal direction of the piezoelectric laminate. Most preferably, the direction (b) is parallel to the longitudinal direction.

As shown in FIGS. 14 to 23, the electrodes (10) and conductive wires (14) are disposed to the piezoelectric vibrators shown in the drawings and the conductive wires (14) are connected to an amplifier (15) and the like. The piezoelectric vibrators can produce a sound as a speaker by connecting to a signal input apparatus (16) such as an audio player or generate haptics by connecting to an oscillator.

Other preferable embodiments of the invention are those which use the piezoelectric laminates shown in FIG. 10 to FIG. 13.

The piezoelectric vibrator of the invention can be assessed by the volume or the like by playing an audio player connected to the amplifier for example.

Next, the piezoelectric vibrator of the invention is explained in further detail.

Polylactic Acid

In the invention, the oriented film layers are made of a polylactic acid. The polylactic acid is preferably a poly-L-lactic acid or a poly-D-lactic acid.

Here, the poly-L-lactic acid is a poly-L-lactic acid substantially consisting of L-lactic acid unit (hereinafter sometimes abbreviated to PLLA), a copolymer of L-lactic acid and another monomer or the like but is particularly preferably the poly-L-lactic acid substantially consisting of L-lactic acid unit. The poly-D-lactic acid is a poly-D-lactic acid substantially consisting of D-lactic acid unit (hereinafter sometimes abbreviated to PDLA), a copolymer of D-lactic acid and another monomer or the like but is particularly preferably the poly-D-lactic acid substantially consisting of D-lactic acid unit.

In view of the crystallinity, the improvement of the effect of increasing the displacement, the heat resistance of the film and the like, the content of the L-(D-)lactic acid unit in the poly-L-(D-)lactic acid is preferably 90 to 100% by mole, more preferably 95 to 100% by mole and further preferably 98 to 100% by mole. In other words, the content of a unit (s) other than the L-(D-)lactic acid unit is preferably 0 to 10% by mole, more preferably 0 to 5% by mole and further preferably 0 to 2% by mole.

The polylactic acid is preferably crystalline, because the above embodiments of the orientation and the crystal are easy to obtain and the effect of increasing the displacement can be improved. The melting point is preferably 150° C. or higher and 190° C. or lower and further preferably 160° C. or higher and 190° C. or lower. Such embodiments result in a film with excellent heat resistance.

The weight average molecular weight (Mw) of the polylactic acid of the invention is preferably 80,000 to 250,000 and more preferably 100,000 to 250,000. The weight average molecular weight (Mw) is particularly preferably 120,000 to 200,000. When the weight average molecular weight Mw is in the above range, the stiffness of the film is excellent and the evenness of the film thickness is excellent.

The helical chiral polymer of the invention may be a copolymer or may contain another resin as long as the effects of the invention are not adversely affected.

The method for producing the polylactic acid of the invention is not particularly restricted, and the method is explained below using methods for producing the poly-L-lactic acid and the poly-D-lactic acid as examples. Examples are direct dehydration condensation of L-lactic acid or D-lactic acid, solid-phase polymerization of an L- or D-lactic acid oligomer, melt ring-opening polymerization of lactide after obtaining lactide by cyclodehydration of L- or D-lactic acid and the like. Among them, a polylactic acid obtained by the direct dehydration condensation or the melt ring-opening polymerization of lactide is preferable in view of the quality and the production efficiency, and the melt ring-opening polymerization of lactide is particularly preferably selected among the methods.

The catalyst used for the production methods is not particularly restricted as long as the polylactic acid having the specific properties above can be polymerized, and a known catalyst can be appropriately used.

After obtaining the poly-L-lactic acid and the poly-D-lactic acid, it is preferable to remove the polymerization catalyst, or deactivate or inactivate the catalytic activity of the polymerization catalyst using a deactivator, according to a conventionally known method, for the melt stability and the moisture thermal stability of the film.

When a deactivator is used, the amount is 0.3 to 20 equivalents, more preferably 0.5 to 15 equivalents, further preferably 0.5 to 10 equivalents and particularly preferably 0.6 to 7 equivalents, relative to one equivalent of a metal element in a specific metal-containing catalyst. When the amount of the deactivator is too low, the activity of the catalyst metal cannot be reduced sufficiently, while use of excess of the deactivator is not preferable because the deactivator may degrade the resin.

Oriented Film Layer

The oriented film layers of the invention are made of the polylactic acid. In each oriented film layer of the invention, the molecular chains are oriented in one direction, in other words, the oriented film layer has a main orientation direction so that the piezoelectric property is exhibited more efficiently. In this regard, the main orientation axis of the invention is the direction of the largest refractive index in the plane direction measured using an ellipsometer (type M-220; JASCO Corporation).

In the invention, the breaking strength of each oriented film layer in the main orientation direction is preferably 120 MPa or more. When the breaking strength is smaller than the lower limit, the effect of improving the resonance property is low. On the other hand, the upper limit of the breaking strength in the main orientation direction is not particularly restricted, but the breaking strength is preferably 300 MPa or less in view of the film formation property and the like. From such a point of view, the lower limit of the breaking strength in the main orientation direction is more preferably 120 MPa or more, further preferably 150 MPa or more and particularly preferably 180 MPa or more, while the upper limit is preferably 300 MPa or less and further preferably 250 MPa or less. When the breaking strength in the main orientation direction is not smaller than the lower limit, the effect of improving the resonance property can be improved.

Moreover, in the invention, the breaking strength in the direction at a right angle to the main orientation axis direction of the oriented film layer is preferably 80 MPa or less. When the breaking strength is not larger than the upper limit, the effect of improving the resonance property can be improved. When the breaking strength in the direction at a right angle to the main orientation axis direction is larger than the upper limit, the effect of improving the resonance property is low. On the other hand, the lower limit of the breaking strength in the direction at a right angle to the main orientation axis direction is not particularly restricted, but the breaking strength is preferably 30 MPa or more and further preferably 50 MPa or more in view of handling after the film formation and the like.

Here, it is preferable that the main orientation direction of the oriented film layer is parallel to (the 0° cut in FIG. 7) or at a right angle to (the 90° cut in FIG. 9) the length direction of the oriented film layer because a large sound by the resonance can be produced more efficiently. Moreover, in the oriented film layer, the direction of the maximum in-plane displacement caused by the piezoelectric strain is preferably in the middle of the main orientation direction of the oriented film layer and the direction at a right angle to the main orientation direction, because a sound can be produced more efficiently.

It is preferable that an oriented film layer made of one enantiomer polymer and an oriented film layer made of another enantiomer polymer are laminated via the conductive layer. In particular, it is preferable that oriented film layers made of one enantiomer polymer and oriented film layers made of another enantiomer polymer are laminated alternately, because the piezoelectric property can be exhibited efficiently while the main orientation axes are arranged in the same direction and a production method such as roll-to-roll processing or coextrusion can be used.

The density of each oriented film layer of the invention is preferably 1.22 to 1.27 g/cm$^3$. When the density is in the range, the effect of improving the resonance property can be improved. When the density is low, the effect of improving the resonance property tends to be low, while when the density is high, the mechanical properties of the film tend to be deteriorated although the effect of improving the resonance property is high. From such a point of view, the density is more preferably 1.225 to 1.26 g/cm$^3$ and further preferably 1.23 to 1.25 g/cm$^3$.

The thickness of each oriented film layer of the invention is not particularly restricted, as long as the resonance property can be obtained, considering that a too thick oriented film layer tends to have too high stiffness and loose the resonance property. It is preferable that the thickness of each layer is 1 to 50 μm. In view of the resonance property, the oriented film layer is preferably thin. In particular, when the lamination number is increased, it is preferable to reduce the thickness of each layer and prevent the laminate as a whole from becoming too thick. From such a point of view, the thickness of each layer of the layers L and the layers D is independently, preferably 25 μm or less, further preferably 15 μm or less and particularly preferably 10 μm or less. When the thickness is in the range, the effect of improving the resonance property can be improved. On the other hand, each layer is preferably thick in view of handling and the stiffness, and for example, the thickness is preferably 2 μm or more and further preferably 3 μm or more.

Impact Modifier

The oriented film layers of the invention preferably contain an impact modifier in an amount of 0.1 to 10% by mass based on the mass of the oriented film layers. The impact modifier of the invention is not particularly restricted as long as it can be used for improving the impact resistance of the polylactic acid for example and the impact modifier is a rubber substance which is rubber elastic at room temperature. Examples are the following impact modifiers.

Specific impact modifiers are an ethylene-propylene copolymer, an ethylene-propylene-nonconjugated diene copolymer, an ethylene-butene-1 copolymer, various acrylic rubbers, an ethylene-acrylic acid copolymer and an alkali metal salt thereof (so-called ionomer), an ethylene-glycidyl (meth)acrylate copolymer, an ethylene-alkyl (meth)acrylate copolymer (for example, an ethylene-methyl acrylate copolymer, an ethylene-ethyl acrylate copolymer, an ethylene-butyl acrylate copolymer and an ethylene-methyl methacrylate copolymer), an ethylene-vinyl acetate copolymer, an acid-modified ethylene-propylene copolymer, a diene rubber (for example, polybutadiene, polyisoprene and polychloroprene), a copolymer of a diene and a vinyl monomer and a hydrogenated product thereof (for example, a styrene-butadiene random copolymer, a styrene-butadiene block copolymer, a styrene-butadiene-styrene block copolymer, a styrene-isoprene random copolymer, a styrene-isoprene block copolymer, a styrene-isoprene-styrene block copolymer, a styrene-ethylene-butylene-styrene block copolymer, a styrene-ethylene-propylene-styrene block copolymer, a graft copolymer of polybutadiene with styrene and a butadiene-acrylonitrile copolymer), polyisobutylene, a copolymer of isobutylene and butadiene or isoprene, a natural rubber, a thiokol rubber, a polysulfide rubber, an acrylic rubber, a silicone rubber, a polyurethane rubber, a polyether rubber, an epichlorohydrin rubber, a polyester elastomer or a polyamide elastomer and the like. Moreover, those having various degrees of crosslinking, those having various microstructures such as a cis-structure and a trans-structure, a multilayer polymer constituted of a core layer and one or more shell layers covering the core layer and the like can also be used. In the invention, as the impact modifier, it is possible to use any of random copolymers, block copolymers, graft copolymers and the like of the (co)polymers cited as the specific examples above. When the (co)polymers are produced, another monomer such as an olefin, a diene, an aromatic vinyl compound, acrylic acid, an acrylic acid ester or a methacrylic acid ester can be copolymerized.

Among the impact modifiers, examples of commercially available products are "Metablen" manufactured by Mitsubishi Rayon Co., Ltd., "Kane Ace" manufactured by Kaneka Corporation, "Paraloid" manufactured by Rohm and Haas Co., "Staphyloid" manufactured by Ganz Chemical Co., Ltd. and "ParaFace" manufactured by Kuraray Co., Ltd. A kind or two or more kinds thereof can be used. In addition, emulsion polymerization is more preferable as a known method. As the production method, a desired monomer mixture is emulsion polymerized to produce core particles, and then another monomer mixture is emulsion polymerized in the presence of the core particles to produce core-shell particles each having a shell layer around the core particle. Another monomer mixture is further emulsion polymerized in the presence of the particles to produce core-shell particles each having a second shell layer. Such reaction is repeated, and a desired multilayer polymer constituted by a core layer and one or more shell layers covering the core layer is obtained. The polymerization temperature for forming the (co)polymer of each layer is preferably 0 to 120° C. and more preferably 5 to 90° C.

In view of the effects of the invention, the multilayer polymer used in the invention more preferably contains a component having a glass transition temperature of 0° C. or lower, further preferably contains a component having a glass transition temperature of −30° C. or lower and particularly preferably contains a component having a glass transition temperature of −40° C. or lower. In the invention, the glass transition temperature is a value measured using a differential scanning calorimeter at a temperature increase of 20° C./minute.

In the invention, the average primary particle size of the multilayer polymer is not particularly restricted, but in view of the effects of the invention, the average primary particle size is preferably 10 to 10000 nm, more preferably 20 to 1000 nm, particularly preferably 50 to 700 nm and most preferably 100 to 500 nm.

In view of the effects of the invention, the content of the impact modifier in the invention is preferably 0.1 to 10% by mass based on the mass of the oriented film layers. When the content is less than the lower limit, the layers are sometimes likely to separate during the treatment such as pressure bonding described below. On the other hand, when the content exceeds the upper limit, the piezoelectric property deteriorates. From such a point of view, the lower limit of the content of the impact modifier is preferably 0.5% by mass and further preferably 1% by mass, while the upper limit is preferably 9% by mass and further preferably 8% by mass. In this regard, by adding such an impact modifier, peeling after pressure bonding can be prevented without deteriorating the piezoelectric property. Although the reason is not clear, it is supposed to be because the flexibility can be given without disturbing the orientation of the oriented polylactic acid films obtained, resulting in the even transmission of the pressure during pressure bonding, and parts which locally easily peel off at the interface of the piezoelectric laminate and parts which are locally strongly pressure bonded disappear.

Method for Producing Oriented Film Layer

The method for producing the oriented film layers is explained below, but the invention is not restricted to the explanations.

Extrusion Step

After adding the impact modifier, a carboxyl group encapsulation agent, a glidant, other additives and the like to the polylactic acid obtained by the above method according to need, the polylactic acid is melted in an extruder and extruded from a die on a cooling drum. In order to prevent the degradation during melting, the polylactic acid to be supplied to the extruder is preferably subjected to a drying treatment before supplying to the extruder, thereby reducing the water content to around 100 ppm or less.

The resin temperature in the extruder is a temperature at which the polylactic acid is fluid enough, namely (Tm+20) to (Tm+50)(° C.), where Tm represents the melting point of the polylactic acid. It is preferable to melt and extrude at a temperature at which the polylactic acid does not degrade, and the temperature is preferably 200 to 260° C., further preferably 205 to 240° C. and particularly preferably 210 to 235° C. A temperature in the range is less likely to cause fluidity unevenness.

Casting Step

After extruding from the die, the film is casted in the cooling drum to obtain an unstretched film. At this point, it is preferable to bring the film into close contact with the cooling drum by applying a static electric charge with electrodes according to an electrostatic adhesion method when the film is cooled and solidified. Here, the electrodes for applying the static electric charge preferably have a wire or knife shape. The surface substance of the electrodes is preferably platinum, because it is possible to prevent impurities sublimated from the film from sticking on the electrode surfaces. Moreover, it is also possible to blow a high-temperature air flow to the electrodes or around the electrodes to keep the electrode temperature at 170 to 350° C., dispose an exhaust nozzle above the electrodes and prevent the impurities from sticking.

Stretching Step

The unstretched film obtained above is stretched uniaxially. The stretching direction is not particularly restricted, but it is preferable to stretch the unstretched film in the film formation direction, the width direction or an oblique direction which forms an angle of 45° with both of the film formation direction and the width direction. For the stretching, the unstretched film is heated to a temperature at which the unstretched film can be stretched, for example the glass transition temperature (Tg)° C. of the polylactic acid or higher to (Tg+80)° C. or lower, and then stretched.

The stretch ratio in the main orientation direction is preferably 3 times or more, more preferably 3.5 times or more, further preferably 4.0 times or more and particularly preferably 4.5 times or more. By adjusting the stretch ratio to the lower limit or more, the effect of increasing the displacement can be improved. On the other hand, the upper limit of the stretch ratio is not particularly restricted, but in view of the film formation property, the stretch ratio is preferably 10 times or less, further preferably 8 times or less and particularly preferably 7 times or less. Although it is not necessary to stretch in the direction at a right angle to the main orientation direction, the film may be stretched in the direction to such an extent as to satisfy the relation of the breaking strengths above. In this case, the stretch ratio is preferably 1.5 times or less and further preferably 1.3 times or less.

Heat Treatment Step

The stretched film obtained above is preferably subjected to a heat treatment. The temperature of the heat treatment is higher than the stretching temperature and lower than the melting point (Tm) of the resin, and the temperature is preferably the glass transition temperature (Tg+15)° C. or higher and (Tm−10)° C. or lower, which can further improve the piezoelectric property. When the temperature of the heat treatment is low, the effect of increasing the displacement tends to be low, while when the temperature is high, the flatness and the mechanical properties of the film tend to be deteriorated and the effect of increasing the displacement tends to be low. From such a point of view, the temperature of the heat treatment is further preferably (Tg+20)° C. or higher and (Tm−20)° C. or lower and particularly preferably (Tg+30)° C. or higher and (Tm−35)° C. or lower. The heat treatment period is preferably 1 to 120 seconds and further preferably 2 to 60 seconds, and the effect of increasing the displacement can be improved.

In addition, in the invention, it is possible to adjust the thermal dimensional stability by employing a relaxation treatment during the heat treatment step.

Adhesion Promoting Treatment

The oriented film layers thus obtained can be subjected to for example a surface activation treatment such as plasma treatment, amine treatment and corona treatment by conventionally known methods, according to need.

Among them, in view of improving the close adhesion to the conductive layers described below and improving the durability of the piezoelectric laminate, it is also preferable that at least one surface of each oriented film layer, preferably both surfaces, is subjected to corona treatment. With respect to the condition of the corona treatment, when the distance between the electrodes is 5 mm for example, the corona treatment is conducted preferably at a voltage of 1 to 20 kV and further preferably at 5 to 15 kV, preferably for 1 to 60 seconds, further preferably for 5 to 30 seconds and particularly preferably for 10 to 25 seconds. In addition, the treatment can be conducted in the atmosphere.

Conductive Layer

The kind of the conductive layers of the invention is not particularly restricted as long as the conductive layers are conductive to such an extent as to exhibit the piezoelectric property when a voltage is applied, but a layer made of a metal or a metal oxide and a layer made of a conductive polymer are preferable because the piezoelectric property and the resonance property can be exhibited more preferably.

The metal or the metal oxide is not particularly restricted, but at least one kind of metal selected from the group consisting of indium, tin, zinc, gallium, antimony, titanium, silicon, zirconium, magnesium, aluminum, gold, silver, copper, palladium and tungsten, or an oxide of at least one kind of metal selected from the group above is preferably used. In addition, the metal oxide may contain a metal in the group above or an oxide of another metal in the group above, according to need. For example, indium oxide containing aluminum, gold or tin oxide, tin oxide containing antimony and the like are preferably used. The conductive polymer is a polythiophene, polyaniline or polypyrrole polymer, and the conductive polymer may be selected taking the electrical conductivity and the transparency into consideration according to need. For example, a polythiophene polymer and a polyaniline polymer, which are excellent in the transparency, are preferably used when used for a display panel and the like.

The thickness of each conductive layer is not particularly restricted, and the thickness may be determined in such a manner that the surface resistance becomes $1 \times 10^4 \Omega/\square$ or less, preferably $5 \times 10^3 \Omega/\square$ or less and further preferably $1 \times 10^3 \Omega/\square$ or less. For instance, the thickness is preferably 10 nm or more. Moreover, when the conductive layer is a layer made of the metal or the metal oxide, the thickness is preferably 15 to 35 nm and more preferably 20 to 30 nm in view of the electrical conductivity and the easiness of layer formation. When the conductive layer is too thin, the surface resistance tends to be high and a continuous coating film is difficult to form. On the other hand, a too thick conductive layer leads to over-quality, and the formation of the laminate film tends to be difficult or the strength between the layers of the laminate film tends to be weak. In addition, in the case of printing using the conductive polymer, the thickness is preferably 100 to 5000 nm and more preferably 200 to 4000 nm.

Here, as shown in FIG. 1, each conductive layer is not formed on the entire surface of the oriented film layer but a margin is left. It is preferable to leave the margin near an end face, in view of more efficiently resonating the diaphragm. In a preferable structure, the electrode and the conductive layer are not short-circuited at the side with the margin, while the electrode and the conductive layer are short-circuited at the side without the margin. With such a structure, the conductive layers sandwiching the respective oriented film layers can be easily short-circuited alternately to the positive and negative electrodes.

Piezoelectric Laminate

That is, in the piezoelectric laminate of the invention, it is necessary that the oriented film layers interposed between the respective conductive layers are laminated in such a manner that the oriented film layers expand and contract in the same direction when a current is applied. This is because, when a resin which expands and contracts in a different direction is included in part of the piezoelectric laminate, the piezoelectric effects counterbalance and the effect of resonating the diaphragm is adversely affected. The method for arranging the oriented film layers in the piezoelectric laminate so that the oriented film layers expand and contract in the same direction is not particularly restricted, but a structure containing the oriented film layers L made of the L-polylactic acid and the oriented film layers D made of the D-polylactic acid which are laminated alternately is preferable, because oriented polylactic acid films which are similarly formed and stretched and thus have the same main orientation axis can be directly laminated alternately. This is because the oriented film layers L and the oriented film layers D exhibit properties of expanding and contracting in the same direction when opposite electric charges are applied in the thickness direction.

When any two neighboring oriented film layers are both the oriented film layers L or the oriented film layers D, the layers can be arranged to expand and contract in the same direction when opposite electric charges are applied, by fixing one of the film layers and laminating the other film layer after turning the film over or rotating the film in the plane direction. In this regard, when the polylactic acid films are formed and laminated by roll-to-roll processing, which is excellent in the productivity, it can be understood that the former structure, which contains the oriented film layers L and the oriented film layers D laminated alternately, is preferable.

Furthermore, when the oriented film layers L and the oriented film layers D are used, the oriented film layers may be laminated in such a manner that the oriented film layers constituting the conductive layer-having film layers A indicated by the symbol 5 in FIGS. 1 to 3 are the oriented film layers L and the oriented film layers constituting the conductive layer-having film layers B indicated by the symbol 6 are the oriented film layers D.

The oriented film layers and the conductive layers are preferably adhered without interposing an adhesive layer having a thickness exceeding 1000 nm, because excellent resonance property is more likely to be exhibited. From such a point of view, in the invention, an embodiment in which the oriented film layers and the conductive layers are adhered without interposing an adhesive layer having a thickness exceeding 500 nm is preferable, and an embodiment of adhering without interposing an adhesive layer having a thickness exceeding 200 nm is further preferable. In view of the resonance property, in the most preferable embodiment, the oriented film layers and the conductive layers are adhered without interposing an adhesive layer.

In the invention, as long as the lamination structure above is contained, another layer may be further contained to an extent that the aim of the invention is not adversely affected. For example, an aromatic polyester layer such as polyethylene terephthalate and polyethylene naphthalate, which is for improving the stiffness of the laminate, may be laminated on a surface of the piezoelectric laminate. However, in view of the resonance property, such a layer is preferably thin, and it is particularly preferable that such a layer is not contained.

In this regard, the shape of the piezoelectric laminate of the invention is preferably a tape, because the handling is easy and it is easy to design so as to achieve high piezoelectric property in the aimed direction.

Lamination Number

With respect to the piezoelectric laminate of the invention, the total number of the oriented film layers is preferably three or larger. Such an embodiment results in excellent resonance property. In view of the resonance property, a larger total number is preferable, and the total number is preferably five or larger and further preferably six or larger.

On the other hand, the upper limit is not particularly restricted. In order to make the total number dozens of thousands, for example, the piezoelectric laminate can be produced like a rolled capacitor.

Moreover, the piezoelectric laminate of the invention has the conductive layer on at least one surface thereof, and in view of the effects of the invention, in other words, in order to resonate the diaphragm more efficiently, it is preferable that all of the oriented film layers similarly exhibit piezoelectric property. As shown in FIG. 6, it is preferable that the conductive layers are laminated on both surfaces of the piezoelectric laminate, because the vibration can be transmitted efficiently to the diaphragm. That is, the number of the conductive layers is preferably n+1, where n represents the number of the oriented film layers.

Resonance Property

The piezoelectric laminate of the invention has piezoelectric property and vibrates when a voltage of a certain frequency is applied. Especially, by selecting and laminating the oriented polylactic acid films which have piezoelectric property in the same direction, as compared to PVDF, the piezoelectric property becomes extremely excellent and a large momentum (force) can be generated.

Main Orientation Direction

In the invention, with respect to the piezoelectric laminate, it is preferable that the variation in the directions of the maximum expansion and contraction of the oriented film layers caused by an applied electric charge is 10 degrees or less when observed from the thickness direction of the piezoelectric laminate. Such an embodiment can improve the effect of improving the resonance property. From such a point of view, the angle that the directions form is more preferably five degrees or less, further preferably three degrees or less, particularly preferably one degree or less and ideally zero degree. In order to achieve the embodiment of the main orientation direction, sampling may be conducted in the same direction during the sampling or the layers may be laminated in the same direction during the lamination.

Method for Producing Piezoelectric Laminate

When the oriented film layers are the oriented film layers L and the oriented film layers D which are laminated alternately for example, the piezoelectric laminate of the invention can be obtained by forming the oriented film layers L and D separately, forming the conductive layer on the surface of each layer obtained, and laminating and adhering the layers into a structure having the layers L and the layers D alternately and the conductive layers between the layers L and the layers D and on at least one surface of the piezoelectric laminate to be obtained, preferably on both surfaces of the piezoelectric laminate.

When the piezoelectric laminate of the invention contains the oriented film layers L only or the oriented film layers D only for example, the piezoelectric laminate can be obtained by preparing two kinds of oriented film layer L (D), forming the conductive layer on the top surface of one kind, forming the conductive layer on the back surface of the other kind or on the top surface in a different direction, forming the kinds separately, forming the conductive layer on the surface of each layer obtained and laminating and adhering the layers into a structure having the layers L and the layers D alternately and the conductive layers between the layers L and the layers D and on at least one surface of the piezoelectric laminate to be obtained, preferably on both surfaces of the piezoelectric laminate.

The method for forming the conductive layers on the surfaces of the oriented film layers L and the oriented film layers D obtained above is not particularly restricted as long as the method is a conventionally known method for forming a conductive layer, but because uniform conductive layers with excellent electrical conductivity can be obtained easily, it is preferable to employ a vapor deposition method or a sputtering method.

Furthermore, the conductive layers may be formed on both surfaces of each oriented film, but in view of the close adhesion, it is preferable to form the conductive layer on one surface only and pressure bond the oriented film and the conductive layer.

Thermal Lamination Step

The conductive layer-having oriented films obtained above are laminated with the lamination structure defined in the invention to form a laminate and adhered by thermal lamination. The thermal lamination is preferably conducted without using an adhesive layer. Moreover, by adding the impact modifier, the pressure adhesiveness can be improved.

The temperature condition of the thermal lamination is preferably (Tg−5) to (Tsm+20)° C. Here, Tg is the highest glass transition temperature among the glass transition temperature of the resin L constituting the oriented film layers L and the glass transition temperature of the resin D constituting the oriented films D used for forming the laminate. Tsm is the lowest subpeak temperature among the subpeak temperature of the oriented films L and the subpeak temperature of the oriented films D used for forming the laminate. In this regard, the subpeak temperature is a temperature related to the heat set temperature during the film production process. By employing the temperature condition, a piezoelectric laminate having excellent resonance property can be obtained. At the same time, the close adhesion of the layers of the laminate is excellent. When the temperature is too low, the close adhesion tends to deteriorate, while when the temperature is too high, the orientation is disturbed and the resonance property tends to deteriorate. From such a point of view, the temperature condition is further preferably (Tg) to (Tsm+15)° C. and particularly preferably (Tg+10) to (Tsm+10)° C.

The pressure condition is not particularly restricted as long as satisfactory pressure bonding is possible and the orientation of the oriented polylactic acid films is not disturbed, and the pressure is preferably 1 to 100 MPa for example. Under such a condition, a laminate excellent in the close adhesion while having excellent resonance property can be obtained. When the pressure is too low, the close adhesion tends to deteriorate, while the resonance property tends to deteriorate when the pressure is too high. From such a point of view, the pressure condition is further preferably 2 to 80 MPa and particularly preferably 2 to 50 MPa.

It is preferable to conduct the thermal lamination for 10 to 600 seconds under the temperature condition and the pressure condition. From this, a laminate excellent in the close adhesion while having excellent resonance property can be obtained. When the period is too short, the close adhesion tends to deteriorate, while the resonance property tends to deteriorate when the period is too long. From such a point of view, the time condition is further preferably 30 to 300 seconds and particularly preferably 60 to 180 seconds.

In order to produce the piezoelectric laminate efficiently by roll-to-roll processing, the oriented film layer L and the oriented film layer D are each formed and wound into a roll, and the conductive layer is formed on part of each oriented film layer in the width direction along the film formation direction. Then, it is preferable to laminate the conductive layer-having oriented film layer L and the conductive layer-having oriented film layer D while slitting along the film formation direction and cut the laminate into a desired size.

Fixing Device or Diaphragm

The fixing device (12) of the invention is not particularly restricted as long as the positions of the grippers can be fixed. In addition, the fixing device (12) may be integrated with the grippers (13). When the diaphragm (12) capable of transmitting a vibration is used as the fixing device (12), the Young's modulus is preferably 3 GPa or more because it is easier to resonate the diaphragm when the diaphragm is slightly harder than the piezoelectric vibrator. In addition, when the grippers are adhered with an adhesive and the like, it is preferable that the adhesiveness is excellent. Because high transparency enables the arrangement on a touchscreen or the screen of a mobile phone and the like, the total light transmittance is preferably 85% or more. From such a point of view, the material of the diaphragm is not particularly restricted as long as the material has the above properties, and the material may be either an organic material or an inorganic material or a combination thereof. Among them, an organic polymer material is preferable because the handling as the diaphragm is easy, and the material is preferably PLA (polylactic acid), PET (polyethylene terephthalate), PEN (polyethylene naphthalate), PS (polystyrene), PC (polycarbonate), COC (cycloolefin copolymer) or PMMA (polymethacrylic acid) and further preferably PLA, PET or PEN.

In addition, the shape of the diaphragm can be appropriately determined depending on the frequency of desired resonance. For example, the shape may be a circle when one wavelength is resonated, and when the resonance is produced at multiple frequencies, a polygon according to the frequencies is selected.

The thickness is preferably similar to that of the piezoelectric laminate. Although the thickness depends also on the material used, the thickness is preferably 3 to 1500 μm and further preferably 25 to 1000 μm in the case of a plastic film such as polyester.

Electrode

As described above, the piezoelectric laminate of the invention is short-circuited to the electrodes in such a manner that electric fields in opposite directions are applied to any oriented film layers neighboring via a respective conductive layer. The electrodes are not particularly restricted and known electrodes may be used. Examples are aluminum, gold, silver and copper, and a silver paste is preferable among them because of the price and the easiness of handling. Moreover, generally used metalicon may be used, and simpler means for piercing the laminate with a metal to short-circuit may also be used.

Piezoelectric Vibrator

The piezoelectric vibrator of the invention has the above structure. Because both ends are fixed with the grippers with the stress applied thereto and the center is not fixed, the piezoelectric vibrator exhibits excellent piezoelectric property.

In the piezoelectric vibrator of the invention, the piezoelectric laminate and the grippers may be adhered with an adhesive, as described above. The adhesion method is not particularly restricted, as long as the piezoelectric laminate and the grippers can be fixed in such a manner that the vibration in the piezoelectric laminate (11) can be transmitted for example to the diaphragm (12). Examples are bonding using an adhesive and a method for pressure bonding the piezoelectric laminate and the diaphragm. In the case of pressure bonding, the diaphragm also serves as the grippers.

When an adhesive is used, the adhesive is not particularly restricted as long as the piezoelectric laminate and the grippers do not separate in the environment in which they are used, the vibration in the piezoelectric laminate can be efficiently transmitted to the diaphragm and the aim is not adversely affected. An epoxy adhesive is especially preferable in view of the versatility and the easiness of handling.

EXAMPLES

The invention is explained in further detail below with Examples, but the invention is not restricted at all by the Examples. The physical properties of each layer and the piezoelectric speaker were assessed by the following methods.

(1) Physical Properties of Each Layer

A notch was made for example by rubbing the edge of the laminate, and then the layers were separated and the physical properties of each layer were assessed.

(1-1) Main Orientation Direction

Using an ellipsometer (type M-220; JASCO Corporation), the obtained film was subjected to a transmitted light measurement using a monochromatic light of 550 nm with various incidence angles. The sample stage on which the film was fixed was rotated around the light axis in the plane perpendicular to the light axis, and the direction of the highest refractive index in the plane direction was determined to be the main orientation axis.

(1-2) Young's Modulus

A sample piece with a length of 150 mm and a width of 10 mm was cut out of the film and the Young's modulus was measured using Tensilon UCT-100 manufactured by Oriented Co., Ltd. The measurement was conducted in a room at a temperature controlled at 23° C. with a humidity controlled at 65% RH, using the sample set with a distance of chucks of 100 mm, in accordance with JIS-C2151 under the condition of a tensile speed of 10 mm/min. The Young's modulus was calculated from the slope of the tangent of the initial portion of the load-extension curve obtained.

(1-3) Total Light Transmittance

The total light transmittance (unit: %) of the film was measured in accordance with JIS K7361 using a haze meter (NDH-2000) manufactured by Nippon Denshoku Industries Co., Ltd.

(1-4) Surface Resistance

The surface resistance was measured in accordance with JIS K7194 using Lorester MCP-T600 (product name) manufactured by Mitsubishi Chemical Corporation. Three sample pieces for the measurement were taken from each film, and the surface resistances were measured at five optional points on each sample piece. The average value thereof was determined to be the surface resistance (unit: Ω/□).

(2) Method for Assessing Piezoelectric Speaker

The piezoelectric speaker was assessed by the following method. As shown in FIG. 14 to FIG. 23, the positive electrode and the negative electrode of the piezoelectric speaker were connected to an AC/DC high-voltage amplifier (manufactured by TREK Inc., product name: Power Source for Piezo Driver PZ P350). An alternating current of a voltage of 200 Vp-p and a current of 200 mA was applied and the maximum volume was measured in the frequency range of 30 Hz to 20 kHz. The volume was measured using a sound level meter (manufactured by Ono Sokki Co., Ltd., product name: High-Functionality Sound Level Meter LA-2560) in front of the piezoelectric speaker at a distance of 3 cm. As the volume is higher, the efficiency as a piezoelectric speaker becomes excellent.

Synthetic Example 1: Synthesis of poly-L-lactic acid (PLLA)

The air in a Fullzone impeller-having vertical mixer tank (40 L) which had a vacuum pipe, a nitrogen gas pipe, a pipe for adding a catalyst, a pipe for adding an L-lactide solution and a pipe for adding an alcohol initiator was replaced with nitrogen. Then, 30 kg of L-lactide, 0.90 kg (0.030 mole/kg) of stearyl alcohol and 6.14 g ($5.05 \times 10^{-4}$ mole/1 kg) of stannous octoate were added, and the temperature was increased to 150° C. in an atmosphere at a nitrogen pressure of 106.4 kPa. Once the materials were melted, mixing was started and the internal temperature was further increased to 190° C. Because the reaction starts when the internal temperature exceeds 180° C., the internal temperature was kept at 185° C. to 190° C. while cooling, and the reaction was continued for an hour. After conducting the reaction at a nitrogen pressure of 106.4 kPa at an internal temperature of 200° C. to 210° C. for an hour while further mixing, mixing was stopped and a phosphorus catalyst deactivator was added.

After leaving still for 20 minutes to remove bubbles, the internal pressure was increased from 2 atm to 3 atm in terms of the nitrogen pressure. The pre-polymer was extruded into a chip cutter, and pellets of the pre-polymer having a weight average molecular weight of 130,000 and a molecular weight distribution of 1.8 were obtained.

Furthermore, the pellets were melted in an extruder and introduced into a shaftless basket-type reactor at 15 kg/hr, and the pressure was decreased to 10.13 kPa to reduce the remaining lactide, followed by forming chips again. The poly-L-lactic acid (PLLA) obtained had a glass transition temperature (Tg) of 55° C., a melting point (Tm) of 175° C., a weight average molecular weight of 120,000, a molecular weight distribution of 1.8 and a lactide content of 0.005% by mass.

Synthetic Example 2: Synthesis of poly-D-lactic acid (PDLA)

A poly-D-lactic acid (PDLA) having a glass transition temperature (Tg) of 55° C., a melting point (Tm) of 175° C., a weight average molecular weight of 120,000, a molecular weight distribution of 1.8 and a lactide content of 0.005% by mass was obtained as in Synthetic Example 1 except that D-lactide was used instead of L-lactide.

Reference Example L1: Production of Oriented Film L1

After sufficiently drying the PLLA obtained in Synthetic Example 1 using a drier, 5% by mass of a core-shell structure (Paraloid™ BPM-500) manufactured by Rohm and Haas Japan Co. was added, and the mixture was introduced into an extruder and melted at 220° C. The melted resin was extruded from a die into a single-layer sheet, and the sheet was cooled and solidified using a cooling drum with a surface temperature of 20° C., thereby obtaining an unstretched film. The unstretched film obtained was led to rolls which were heated to 75° C., stretched to 1.1 times in the lengthwise direction and cooled with rolls at 25° C. Then, the lengthwise stretched film was led to a tenter while holding both edges with clips and stretched to 4.0 times in the cross direction in an atmosphere heated to 75° C. Then, a heat treatment was conducted in the tenter at 110° C. for 30 seconds, and the film was evenly and slowly cooled to room temperature, thereby obtaining a biaxially oriented poly-L-lactic acid single-layer film (an oriented film L1) having a thickness of 7 μm. The main orientation direction was the cross direction, in which the film was stretched. In this regard, the surface on which the conductive layer was formed, as explained below, was subjected to corona treatment using a high frequency power source type CG-102 manufactured by Kasuga, Inc. under the condition of a voltage of 10 kV and a treatment period of 20 seconds.

Reference Example D1: Production of Oriented Film D1

Using the PDLA obtained in Synthetic Example 2, a biaxially oriented poly-D-lactic acid single-layer film (an oriented film D1) having a thickness of 7 μm was obtained as in Reference Example L1. The main orientation direction was the cross direction, in which the film was stretched. In this regard, the surface on which the conductive layer was formed, as explained below, was subjected to corona treatment using a high frequency power source type CG-102 manufactured by Kasuga, Inc. under the condition of a voltage of 10 kV and a treatment period of 20 seconds.

Example 1

The first preferable embodiment of the invention is specifically explained based on the drawings.

Cutting

First, pieces of 3 cm×7 cm were cut out of the oriented film L1 obtained in Reference Example L1 and the oriented film D1 obtained in Reference Example D1, in such a manner that the direction of the stretching in the cross direction formed an angle of 45° with the long sides.

Formation of Conductive Layer

Next, as shown in FIG. 1, an area between one short side and a line 1 cm away from the short side (an area of 3 cm×1 cm) was masked as a margin to leave an area which was not deposited, and aluminum was deposited on the remaining area (an area of 3 cm×6 cm) to a thickness resulting in a surface resistance of 10Ω/□. With respect to the position of the margin, the margin of each oriented film L1 was left on the short side opposite to the short side of each oriented film D1 on which the margin was left.

Lamination

The obtained deposited oriented films L1 and oriented films D1 were laminated alternately to a total lamination number of 20 (10 films each). Then, a piezoelectric laminate was obtained after thermal pressure bonding at 110° C. at a pressure of 20 MPa for three minutes.

Electrode

A conductive adhesive (manufactured by Nisshin EM Corporation, Shirubesuto P255) was coated on both of the short sides of the obtained laminate to form the electrodes (symbol 10), and thus the piezoelectric laminate (11) was produced. As a result, in each aluminum deposition layer, the conductive adhesive and the aluminum deposition layer were not short-circuited at the side with the margin, while the conductive adhesive and the aluminum deposition layer were short-circuited at the side without the margin.

Assembly

A stereocomplex polylactic acid film (manufactured by Teijin Limited, trade name: Biofront, thickness: 700 μm, Young's modulus: 3 GPa, total light transmittance: 93%) was prepared, and a piece with a length of 10.5 cm and a width of 13.0 cm was cut out of the film and used as the diaphragm (12). Moreover, four pieces with a length of 5 cm and a width of 2 cm were cut out of the same stereocomplex polylactic acid film, and an epoxy resin adhesive (manufactured by Huntsman Advanced Materials, product name: Araldite Standard) was coated on one surface of each piece, thereby preparing materials for the grippers.

Then, the conductive wires (14) were connected to the electrodes (10) of the piezoelectric laminate (11) produced above. As shown in FIG. 15 and FIG. 16, each end of the piezoelectric laminate (11) with the electrode (10) was sandwiched with two of the materials for the grippers, in such a manner that the surfaces coated with the epoxy resin adhesive faced each other, and the grippers (13) were adhered to both ends of the piezoelectric laminate (11) in the longitudinal direction.

Then, the diaphragm (12) was placed flat, and the bases of the grippers (13) of the piezoelectric laminate were adhered with the epoxy resin adhesive in the center of the top surface of the diaphragm (12). In this regard, the longitudinal direction of the diaphragm (12) and the longitudinal direction of the piezoelectric laminate (11) were arranged in parallel, and one of the two grippers was adhered with the adhesive first and the other gripper (13) was then adhered similarly in a state of applying a tensile stress to the piezoelectric laminate. In this regard, the tensile stress was applied by attaching a string to the unfixed gripper, hanging the tip of the string from the edge of the diaphragm in the vertical direction and applying a load of 50 g to the hanging string.

Each of the grippers (13) was adhered to the piezoelectric laminate via an area of 5 cm×0.5 cm, and the remaining parts of the materials for the grippers were adhered to each other. That is, a margin of 0.5 cm protruded from each of the grippers.

Properties as Piezoelectric Speaker

With respect to the piezoelectric vibrator obtained above, the positive electrode and the negative electrode were connected to an AC/DC high-voltage amplifier (manufactured by TREK Inc., product name: Power Source for Piezo Driver PZP350). An alternating current of a voltage of 200 Vp-p and a current of 200 mA was applied and the volume was measured according to the method for assessing the piezoelectric speaker. As a result, the volume was 102 dB. The volume was measured in front of the piezoelectric vibrator at a distance of 3 cm.

The volume was 94 dB when the lamination number was reduced from 20 to 10, while the volume was 112 dB when the lamination number was increased to 40. Moreover, when the cut size was changed from 3 cm×7 cm to 5 cm×5 cm and 3 cm×14 cm, the volumes were 105 dB and 108 dB, respectively.

The volume was 103 dB when the load applied when the gripper was adhered was decreased from 50 g to 35 g, while the volume was 98 dB when the load was increased from 50 g to 65 g.

Properties as Vibration Generator

With respect to the piezoelectric vibrator obtained above, the positive electrode and the negative electrode were connected to an AC/DC high-voltage amplifier (manufactured by TREK Inc., product name: Power Source for Piezo Driver PZP350). An alternating current of a voltage of 300 Vp-p, a current of 200 mA and a frequency of 120 Hz was applied.

When the diaphragm was touched with hands, a strong vibration could be felt.

The vibration was weaker when the lamination number was reduced from 20 to 10, while a stronger vibration was felt when the lamination number was increased to 40. Moreover, when the cut size was changed from 3 cm×7 cm to 5 cm×5 cm and 3 cm×14 cm, the vibration was comparable with the size of 5 cm×5 cm and stronger with the size of 3 cm×14 cm.

The vibration was weaker when the load applied when the gripper was adhered was decreased from 50 g to 35 g, while a stronger vibration was felt when the load was increased from 50 g to 65 g.

A polyethylene-2,6-naphthalate film (manufactured by Teijin DuPont Limited, trade name: Teonex Q65, thickness: 700 μm, Young's modulus: 6 GPa, total light transmittance: 88%) and a polyethylene-terephthalate film (manufactured by Teijin DuPont Limited, trade name: Tetoron G2, thickness: 700 Young's modulus: 4 GPa, total light transmittance: 85%) were used for the diaphragm and the grippers instead of the stereocomplex polylactic acid film, and excellent volumes and vibrations were exhibited similarly.

Example 2

The second preferable embodiment of the invention is specifically explained based on the drawings.

First, a piezoelectric vibrator was produced as in Example 1.

Assembly

A stereocomplex polylactic acid film (manufactured by Teijin Limited, trade name: Biofront, thickness: 200 Young's modulus: 3 GPa, total light transmittance: 95%) was prepared, and a piece with a length of 18.5 cm and a width of 26.4 cm was cut out of the film and used as the diaphragm. Moreover, four pieces with a length of 7.5 cm and a width of 0.5 cm were cut out of the same stereocomplex polylactic acid film, and an epoxy resin adhesive (manufactured by Huntsman Advanced Materials, product name: Araldite Standard) was coated on one surface of each piece, thereby preparing materials for the grippers.

Then, the conductive wires (14) were connected to the electrodes (10) of the piezoelectric laminate (11) produced above. As shown in FIG. 18 and FIG. 19, the middle of each end of the piezoelectric structure without the electrode was sandwiched with two of the materials for the grippers, in such a manner that the surfaces coated with the epoxy resin adhesive faced each other, and the grippers (13) were adhered along the longitudinal direction of the piezoelectric laminate (11).

Then, the diaphragm (12) was placed flat, and the bases of the grippers (13) of the piezoelectric laminate were adhered with the epoxy resin adhesive in the center of the top surface of the diaphragm (12). In this regard, the longitudinal direction of the diaphragm and the longitudinal direction of the piezoelectric laminate were arranged in parallel. Moreover, one of the two grippers was adhered with the adhesive first and the other gripper was then adhered similarly in a state of applying a compressive stress to the piezoelectric laminate (11). In this regard, while the width of the piezoelectric laminate between the grippers was 2.5 cm, the grippers were adhered at a shorter distance of 2.3 cm so that the piezoelectric laminate (11) was curved convexly, thereby applying the compressive stress.

Each of the grippers (13) was adhered to the piezoelectric laminate via an area of 7 cm×0.25 cm, and the remaining parts of the materials for the grippers were adhered to each other.

Properties as Piezoelectric Speaker

With respect to the piezoelectric vibrator obtained above, the positive electrode and the negative electrode were connected to an AC/DC high-voltage amplifier (manufactured by TREK Inc., product name: Power Source for Piezo Driver PZP350). An alternating current of a voltage of 200 Vp-p and a current of 200 mA was applied and the volume was measured according to the method for assessing the piezoelectric speaker. As a result, the volume was 106 dB. The volume was measured in front of the piezoelectric vibrator at a distance of 3 cm.

The volume was 100 dB when the lamination number was reduced from 20 to 10, while the volume was 116 dB when the lamination number was increased to 40. Moreover, when the cut size was changed from 3 cm×7 cm to 5 cm×5 cm and 3 cm×14 cm, the volumes were 110 dB and 108 dB, respectively.

The volume was 107 dB when the distance between the grippers was reduced from 2.3 cm to 2.1 cm when the grippers (13) were adhered, while the volume was 99 dB when the distance was increased from 2.3 cm to 2.4 cm.

Properties as Vibration Generator

With respect to the piezoelectric vibrator (11) obtained above, the positive electrode and the negative electrode were connected to an AC/DC high-voltage amplifier (manufactured by TREK Inc., product name: Power Source for Piezo Driver PZP350). An alternating current of a voltage of 300 Vp-p, a current of 200 mA and a frequency of 120 Hz was applied. When the diaphragm (12) was touched with hands, a vibration could be felt although the vibration was not as strong as that in Example 1.

The vibration was weaker when the lamination number was reduced from 20 to 10, while a stronger vibration was felt when the lamination number was increased to 40. Moreover, when the cut size was changed from 3 cm×7 cm to 5 cm×5 cm and 3 cm×14 cm, the vibration was weaker with the size of 5 cm×5 cm and stronger with the size of 3 cm×14 cm.

The vibration was weaker when the distance between the grippers was reduced from 2.3 cm to 2.1 cm when the grippers (13) were adhered, while a stronger vibration was felt when the distance was increased from 2.3 cm to 2.4 cm.

A polyethylene-2,6-naphthalate film (manufactured by Teijin DuPont Limited, trade name: Teonex Q65, thickness: 200 μm, Young's modulus: 6 GPa, total light transmittance: 89%) and a polyethylene-terephthalate film (manufactured by Teij in DuPont Limited, trade name: Tetoron G2, thickness: 200 μm, Young's modulus: 4 GPa, total light transmittance: 87%) were used for the diaphragm (12) and the grippers instead of the stereocomplex polylactic acid film, and excellent volumes and vibrations were exhibited similarly.

Example 3

Figure 22:
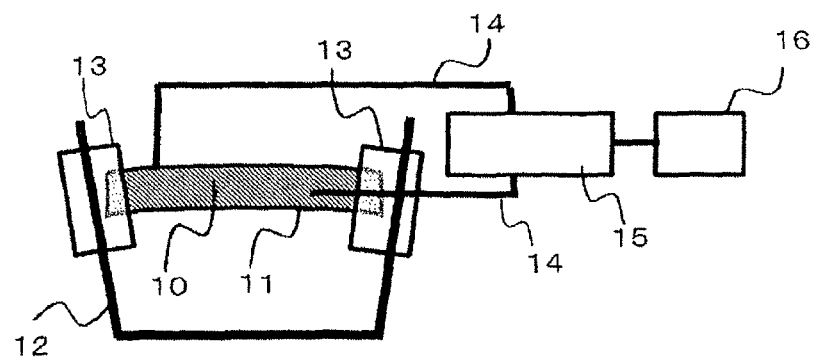
FIG. 22 is a two-dimensional view of another preferable embodiment of the piezoelectric vibrator of the invention seen from a front surface.

Another embodiment of the second preferable embodiment of the invention is specifically explained based on the drawings. First, the piezoelectric laminate (11) with the grippers was produced as in Example 2. Then, as shown in FIG. 22 and FIG. 23, a hole (indicated by the symbol 12) which the fixing device was led through was pierced in the middle of each gripper (13) in the longitudinal direction. An aluminum plate with a length of 10 cm, a width of 2 cm and a thickness of 0.5 mm was prepared as the fixing device (12) and curved with an angle of 80° along the lines 4 cm away from the sides in the length direction so that the aluminum plate had an U-shape with an open top as shown in FIG. 22. Then, the U-shaped fixing device was led through the holes in the grippers as shown in FIG. 22. While the width of the piezoelectric laminate between the grippers was 2.5 cm, the grippers through which the fixing device was led were fixed at a shorter distance of 2.3 cm with the fixing device so that the piezoelectric laminate was curved convexly.

Each of the grippers was adhered to the piezoelectric laminate via an area of 7 cm×0.25 cm, and the remaining parts of the materials for the grippers were adhered to each other.

Properties as Piezoelectric Speaker

With respect to the piezoelectric vibrator obtained above, the positive electrode and the negative electrode were connected to an AC/DC high-voltage amplifier (manufactured by TREK Inc., product name: Power Source for Piezo Driver PZP350). An alternating current of a voltage of 200 Vp-p and a current of 200 mA was applied and the volume was measured according to the method for assessing the piezoelectric speaker. As a result, the volume was 113 dB. The volume was measured in front of the piezoelectric vibrator at a distance of 3 cm.

The volume was 108 dB when the lamination number was reduced from 20 to 10, while the volume was 120 dB when the lamination number was increased to 40. Moreover, when the cut size was changed from 3 cm×7 cm to 5 cm×5 cm and 3 cm×14 cm, the volumes were 115 dB and 117 dB, respectively.

The volume was 116 dB when the distance between the grippers was reduced from 2.3 cm to 2.1 cm when the grippers (13) were adhered, while the volume was 110 dB when the distance was increased from 2.3 cm to 2.4 cm.

Although the volume range achieving the volume of 100 dB was 4800 Hz to 9100 Hz with the piezoelectric vibrator of Example 2, the range was 1800 Hz to 8600 Hz with the piezoelectric vibrator of Example 3. Thus, the piezoelectric vibrator of Example 3 is a very preferable embodiment as a piezoelectric speaker because the available sound range is wide.

INDUSTRIAL APPLICABILITY

The piezoelectric vibrator of the invention can be preferably used as a piezoelectric speaker and a vibration generator such as a signal input apparatus.

REFERENCE SIGNS LIST

1: Oriented film layer A
2: Oriented film layer B
3: Conductive layer A
4: Conductive layer B
5: Conductive layer-having film layer A
6: Conductive layer-having film layer B
7: Parallel surface in piezoelectric laminate
8: End face parallel to longitudinal direction of piezoelectric laminate
9: End face not parallel to longitudinal direction of piezoelectric laminate
10: Electrode
11: Piezoelectric laminate
12: Fixing device or diaphragm
13: Gripper
14: Conductive wire 15: Amplifier
16: Signal input apparatus
a: Main orientation direction in oriented film layer
b: Direction of maximum in-plane displacement caused by piezoelectric strain in oriented film layer
x: Longitudinal direction of oriented film layer
y: Direction at a right angle to thickness direction and longitudinal direction of oriented film layer
z: Thickness direction of oriented film layer and lamination direction of piezoelectric laminate

The invention claimed is:

1. A piezoelectric vibrator having a piezoelectric laminate in which oriented film layers made of a polylactic acid and conductive layers are laminated alternately and grippers gripping both ends of the piezoelectric laminate: wherein
 (i) the piezoelectric laminate is laminated in such a manner that one of two conductive layers neighboring via an oriented film layer is short-circuited to a negative electrode and the other conductive layer is short-circuited to a positive electrode and the oriented film layers interposed between the respective conductive layers expand and contract in the same direction when a current is applied;
 (ii) the piezoelectric laminate has two parallel surfaces which are parallel to the plane direction of the oriented film layers and two end faces A and B which are between the parallel surfaces and parallel to each other; and
 (iii) the gripped ends respectively include the end face A and the end face B, and a stress is applied by the grippers to the part of the piezoelectric laminate between the end faces A and B,
 wherein each of the oriented film layers is at least a kind selected from the group consisting of an oriented film layer L made of a resin L containing a poly-L-lactic acid as the main component m layer D made of a resin D containing a poly-D-lactic acid as the main component;
 wherein each of the oriented film layers comprises molecular chains oriented in one direction.

2. The piezoelectric vibrator described in claim 1, wherein the shape of the piezoelectric laminate is a tape.

3. The piezoelectric vibrator described in claim 1, wherein the grippers gripping the ends are fixed on a diaphragm and the stress applied to the piezoelectric laminate by the grippers is a tensile stress.

4. The piezoelectric vibrator described in claim 3, wherein the end faces A and B are at the ends of the piezoelectric laminate in the longitudinal direction.

5. The piezoelectric vibrator described in claim 1, wherein the stress applied to the piezoelectric laminate by the grippers is a compressive stress.

6. The piezoelectric vibrator described in claim 5, wherein the positions of the grippers at the ends are fixed.

7. The piezoelectric vibrator described in claim 5, wherein the positions of the grippers at the ends are movable according to expansion and contraction of the piezoelectric laminate.

8. The piezoelectric vibrator described in claim 3, wherein the end faces A and B are at the ends of the piezoelectric laminate parallel to the longitudinal direction.

9. The piezoelectric vibrator described in claim 1, wherein the number of the oriented film layers in the piezoelectric laminate is three or larger.

10. The piezoelectric vibrator described in claim 1, wherein the oriented film layers each have a thickness of 25 µm or less.

11. The piezoelectric vibrator described in claim 1, wherein the direction of the maximum expansion and contraction of the piezoelectric laminate is parallel to or at a right angle to the end faces A and B.

12. The piezoelectric vibrator described in claim 1, wherein the conductive layers have a surface specific resistance of $1\times10^4$ Ω/sq or less.

13. The piezoelectric vibrator described in claim 1 which is used for a piezoelectric speaker.

14. The piezoelectric vibrator described in claim 1 which is used for a signal input apparatus.

15. The piezoelectric vibrator described in claim 2, wherein the grippers gripping the ends are fixed on a diaphragm and the stress applied to the piezoelectric laminate by the grippers is a tensile stress.

16. The piezoelectric vibrator described in claim 2, wherein the stress applied to the piezoelectric laminate by the grippers is a compressive stress.

17. The piezoelectric vibrator described in claim 1, wherein the oriented film layers comprise the oriented film layer L and the oriented film layer D laminated alternately.

* * * * *